US008580602B2

(12) United States Patent
Garnett

(10) Patent No.: US 8,580,602 B2
(45) Date of Patent: *Nov. 12, 2013

(54) POLYCRYSTALLINE CDTE THIN FILM SEMICONDUCTOR PHOTOVOLTAIC CELL STRUCTURES FOR USE IN SOLAR ELECTRICITY GENERATION

(71) Applicant: James David Garnett, Simi Valley, CA (US)

(72) Inventor: James David Garnett, Simi Valley, CA (US)

(73) Assignee: Uriel Solar, Inc., Westlake Village, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/628,016

(22) Filed: Sep. 26, 2012

(65) Prior Publication Data

US 2013/0081682 A1    Apr. 4, 2013

Related U.S. Application Data

(63) Continuation of application No. 12/505,391, filed on Jul. 17, 2009, now Pat. No. 8,298,856.

(60) Provisional application No. 61/081,625, filed on Jul. 17, 2008, provisional application No. 61/082,759, filed on Jul. 22, 2008, provisional application No. 61/186,788, filed on Jun. 12, 2009.

(51) Int. Cl.
*H01L 21/00*    (2006.01)

(52) U.S. Cl.
USPC ............... 438/84; 438/72; 438/97; 438/98; 438/99; 257/E21.068

(58) Field of Classification Search
None
See application file for complete search history.

(56) References Cited

U.S. PATENT DOCUMENTS

| | | |
|---|---|---|
| 2,929,859 A | 3/1960 | Loferski |
| 4,292,092 A | 9/1981 | Hanak |
| 4,536,607 A | 8/1985 | Wiesmann |
| 4,680,422 A | 7/1987 | Stanbery |
| 4,706,604 A | 11/1987 | Hager |
| 4,710,589 A | 12/1987 | Meyers et al. |
| 4,753,684 A | 6/1988 | Ondris et al. |
| 4,816,420 A | 3/1989 | Bozler et al. |

(Continued)

FOREIGN PATENT DOCUMENTS

| | | |
|---|---|---|
| EP | 0266050 A2 | 5/1988 |
| EP | 0266050 A3 | 4/1989 |

(Continued)

OTHER PUBLICATIONS

Amin, et al. Effect of ZnTe and CdZnTe Alloys at the Back Contact of 1-μm-Thick CdTe Thin Film Solar Cells. Japanese Journal of Applied Physics. 2002; 41:2834-2841.

(Continued)

*Primary Examiner* — Kyoung Lee
(74) *Attorney, Agent, or Firm* — Wilson Sonsini Goodrich & Rosati

(57) ABSTRACT

A reverse p-n junction solar cell device and methods for forming the reverse p-n junction solar cell device are described. A variety of n-p junction and reverse p-n junction solar cell devices and related methods of manufacturing are provided. N-intrinsic-p junction and reverse p-intrinsic-n junction solar cell devices are also described.

26 Claims, 6 Drawing Sheets

(56) References Cited

U.S. PATENT DOCUMENTS

| | | |
|---|---|---|
| 4,977,097 A | 12/1990 | Meyers et al. |
| 4,999,694 A | 3/1991 | Austin et al. |
| 5,009,720 A | 4/1991 | Hokuyu et al. |
| 5,028,561 A | 7/1991 | Kamath et al. |
| 5,248,631 A | 9/1993 | Park et al. |
| 5,477,809 A | 12/1995 | Kawano |
| 5,616,178 A | 4/1997 | Toda et al. |
| 5,738,731 A | 4/1998 | Shindo et al. |
| 5,759,266 A | 6/1998 | Kawano |
| 5,780,322 A | 7/1998 | Tamamura et al. |
| 5,898,662 A | 4/1999 | Ishibashi et al. |
| 5,909,632 A | 6/1999 | Gessert |
| 5,998,235 A | 12/1999 | Mitra |
| 6,069,020 A | 5/2000 | Kato et al. |
| 6,255,708 B1 | 7/2001 | Sudharsanan et al. |
| 6,274,804 B1 | 8/2001 | Psyk et al. |
| 6,380,480 B1 | 4/2002 | Norimatsu et al. |
| 6,548,751 B2 | 4/2003 | Sverdrup, Jr. et al. |
| 6,657,194 B2 | 12/2003 | Ashokan et al. |
| 6,759,312 B2 | 7/2004 | Walykiewicz et al. |
| 6,852,614 B1 | 2/2005 | Compaan et al. |
| 6,891,869 B2 | 5/2005 | Augusto |
| 7,141,863 B1 | 11/2006 | Compaan et al. |
| 8,093,094 B2 | 1/2012 | Stahle et al. |
| 8,298,856 B2 * | 10/2012 | Garnett ............................ 438/84 |
| 2001/0047819 A1 | 12/2001 | Sannomiya et al. |
| 2003/0136442 A1 | 7/2003 | Takamoto |
| 2004/0166681 A1 | 8/2004 | Iles et al. |
| 2005/0072461 A1 | 4/2005 | Kuchinski et al. |
| 2005/0151128 A1 | 7/2005 | Augusto |
| 2005/0268963 A1 | 12/2005 | Jordan et al. |
| 2006/0021565 A1 | 2/2006 | Zahler et al. |
| 2006/0180197 A1 | 8/2006 | Gui et al. |
| 2007/0272296 A1 | 11/2007 | Brabec et al. |
| 2007/0277874 A1 | 12/2007 | Dawson-Elli et al. |
| 2007/0277875 A1 | 12/2007 | Gadkaree et al. |
| 2008/0023059 A1 | 1/2008 | Basol |
| 2009/0173373 A1 | 7/2009 | Walukiewicz et al. |
| 2010/0012188 A1 | 1/2010 | Garnett |
| 2010/0015753 A1 | 1/2010 | Garnett |
| 2010/0096001 A1 | 4/2010 | Sivananthan et al. |

FOREIGN PATENT DOCUMENTS

| | | |
|---|---|---|
| JP | 07-147422 A | 6/1995 |
| JP | 09-237907 A | 9/1997 |
| JP | 10-303445 A | 11/1998 |
| WO | WO 2007/129097 A2 | 11/2007 |
| WO | WO 2007/129097 A3 | 6/2008 |
| WO | WO 2009/042125 A1 | 4/2009 |

OTHER PUBLICATIONS

Baron, et al. Plasma nitrogen doping of ZnTe, Cd1-xZnxTe, and CdTe by molecular beam epitaxy. Applied Physics Letters. Sep. 1994; vol. 65, Issue: 10, pp. 1284-1286.

Barrioz, et al. Highly arsenic doped CdTe layers for the back contacts of CdTe solar cells. Mater.Res. Soc.Symp. Proc. vol. 1012. 2007 Materials Research Society. 1012-Y12-08 (6 pages).

Bassani, et al. Indium doping of CdTe layers and CdTe/Cd1—xZnxTe microstructures. Journal of Crystal Growth. Feb. 2, 1992; vol. 117, Issues 1-4, pp. 391-395.

De Lyon, et al. Direct molecular-beam epitaxial growth of ZnTe(100) and CdZnTe(100)/ZnTe(100) on Si(100) substrates. Appl. Phys. Lett. 63, 818 (1993).

Gessert, et al. Formation of ZnTe:Cu/Ti contacts at high temperature for CdS/CdTe devices. National Renewable Energy Laboratory. Conference Paper. NREL/CP-520-39804. May 2006. (6 pages).

Goren, et al. Single crystalline CdTe solar cells grown by MOCVD. Solar Energy Materials and Solar Cells, vol. 44, No. 4, Dec. 15, 1996, pp. 341-356(16).

International search report and written opinion dated Aug. 17, 2011 for PCT Application No. US2010/059969.

International search report dated Mar. 17, 2010 for PCT Application No. US2009/51055.

Office action dated Feb. 14, 2012 for U.S. Appl. No. 12/505,369.
Office action dated Mar. 21, 2011 for U.S. Appl. No. 12/505,391.
Office action dated Jun. 6, 2012 for U.S. Appl. No. 12/505,369.
Office action dated Jun. 6, 2012 for U.S. Appl. No. 12/505,391.
Office action dated Sep. 6, 2011 for U.S. Appl. No. 12/505,391.

Rohatgi, et al. An improved understanding of efficiency limiting defects in polyerystalline CdTe/CdS solar cells. Proceedings of the Photovoltaic Specialists Conference. 1991; 962-966.

Rohatgi, et al. Wide bandgap thin film solar cells from CdTe alloys. 20th IEEE Photovoltaic Specialists Conference. 1988; 1477-1481.

Romeo, et al. Back contacts to CSS CdS/CdTe solar cells and stability of performances. Thin Solid Films. 2000; 361-362:327-329.

Spath, et al. Nitrogen doping of ZnTe and its influence on CdTe/ZnTe interfaces. Applied Physics Letters, 2007; 90 (6):062112-1-062112-3.

Wu, et al. High-efficiency CTO/ZTO/DdS/CdTe polycrystalline thin-film solar cells. National Renewable Energy Laboratory. Conference Paper. NREL/CP-520-31025. Oct. 2001. (4 pages).

Yang, et al. Effects of in doping on the properties of CdZnTe single crystals. Jornal of Crystal Growth. 2005; 238:431-437.

Office action dated Jan. 18, 2013 for U.S. Appl. No. 12/965,800.
Office action dated Mar. 6, 2013 for U.S. Appl. No. 12/505,369.
Office action dated Sep. 4, 2013 for U.S. Appl. No. 12/505,369.

* cited by examiner

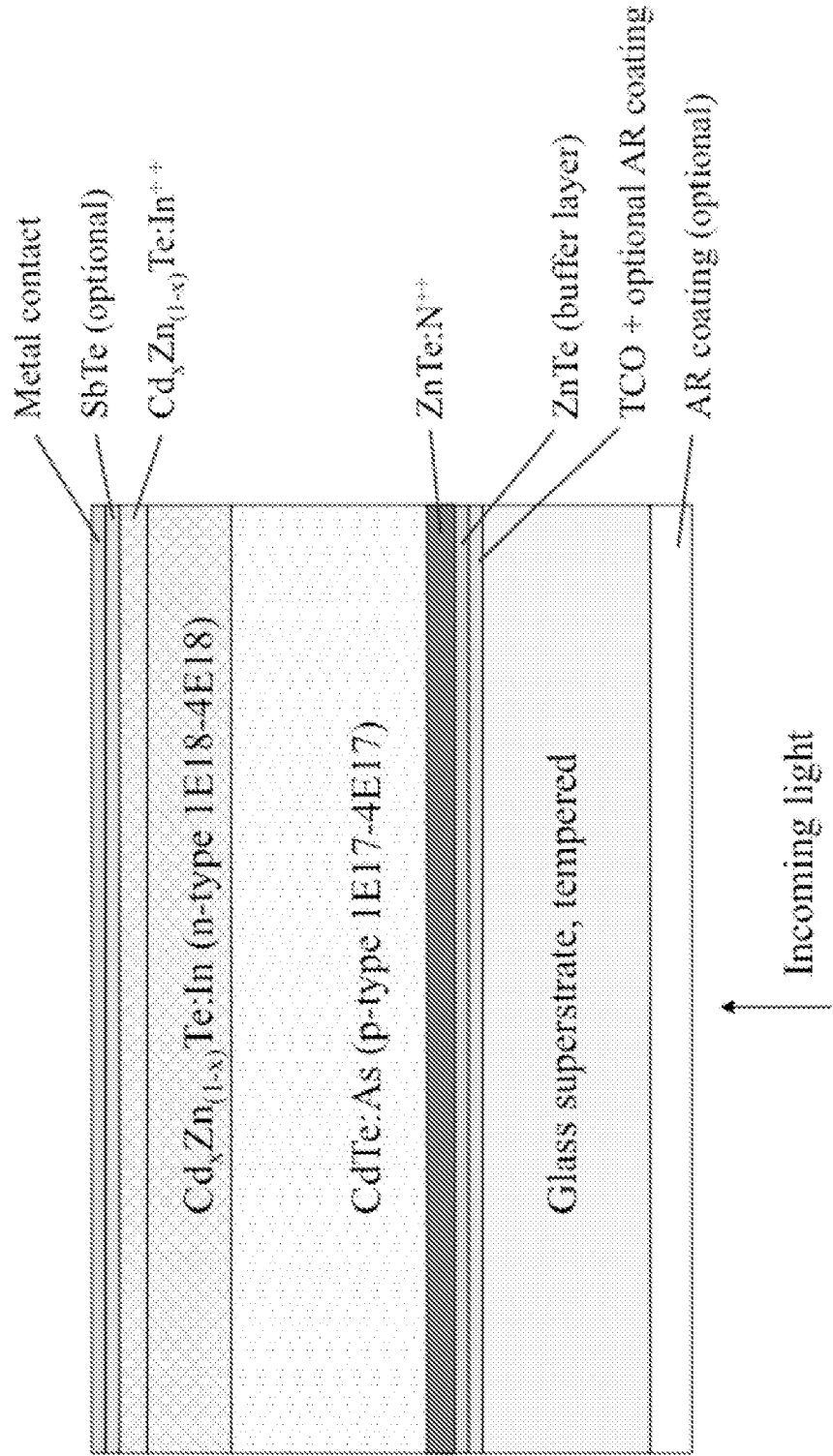
Figure 1. "Reversed" p-n junction solar cell

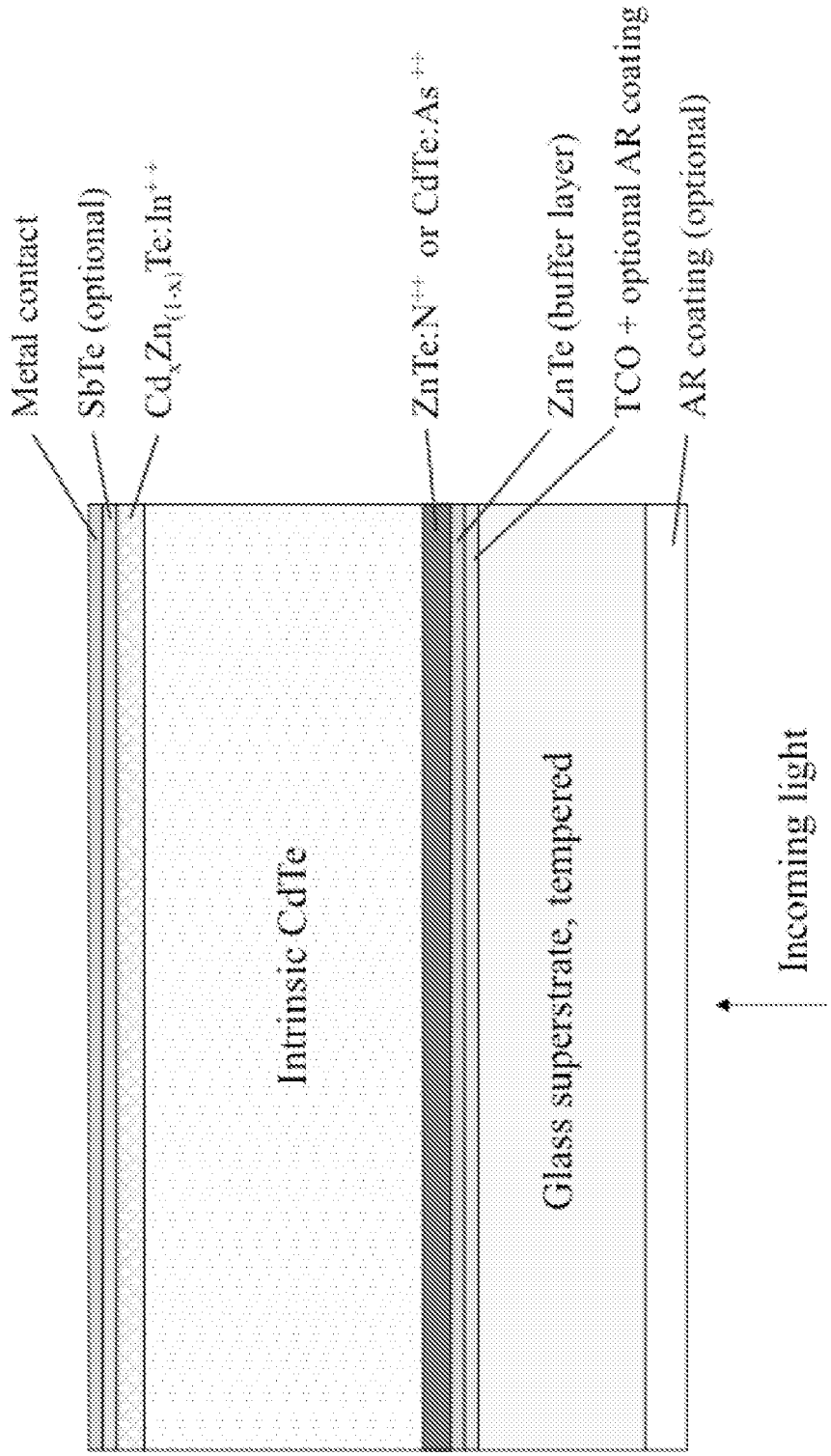
Figure 2. "Reversed" p-insulator-n junction solar cell

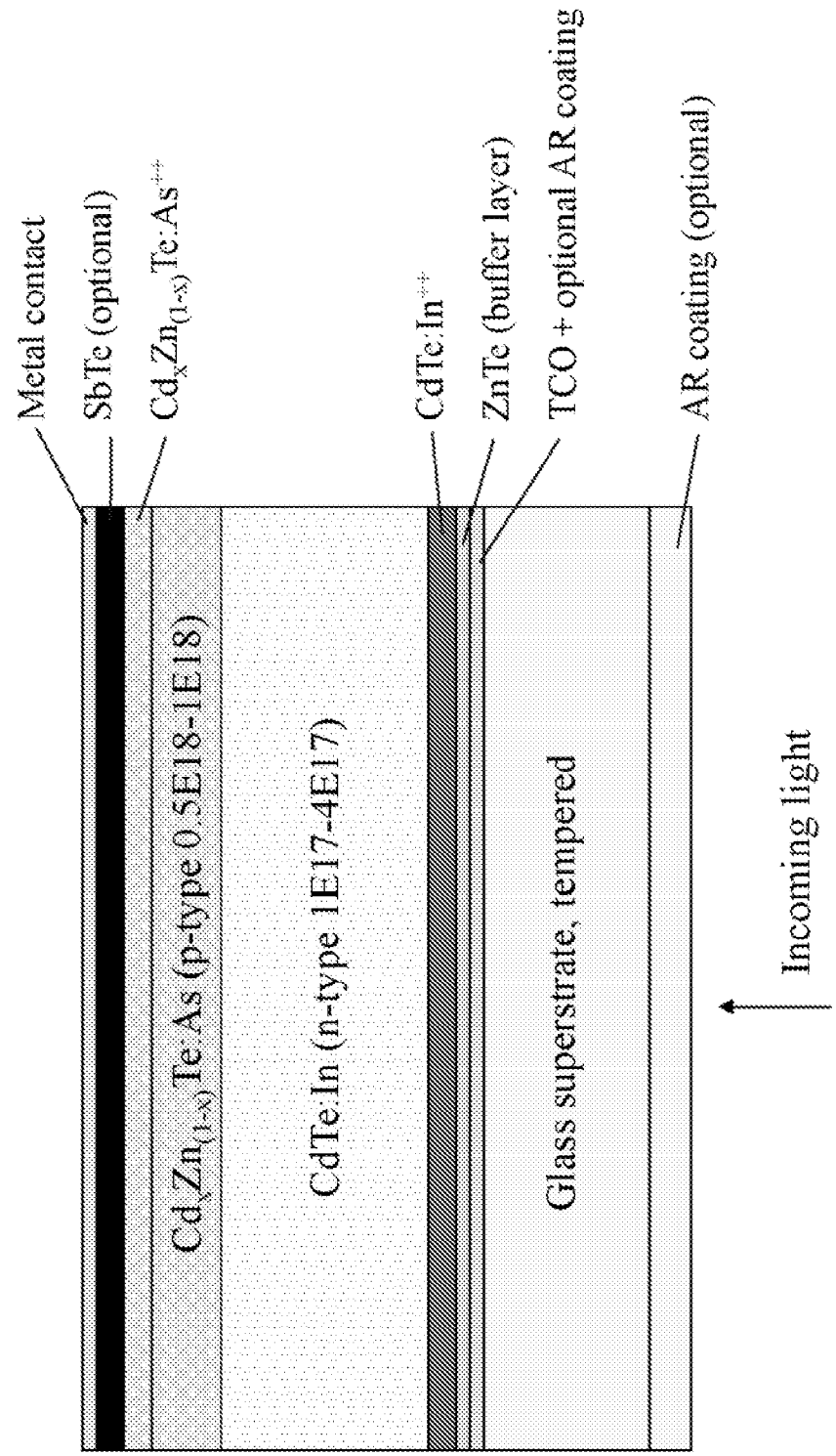
Figure 3. N-p junction solar cell

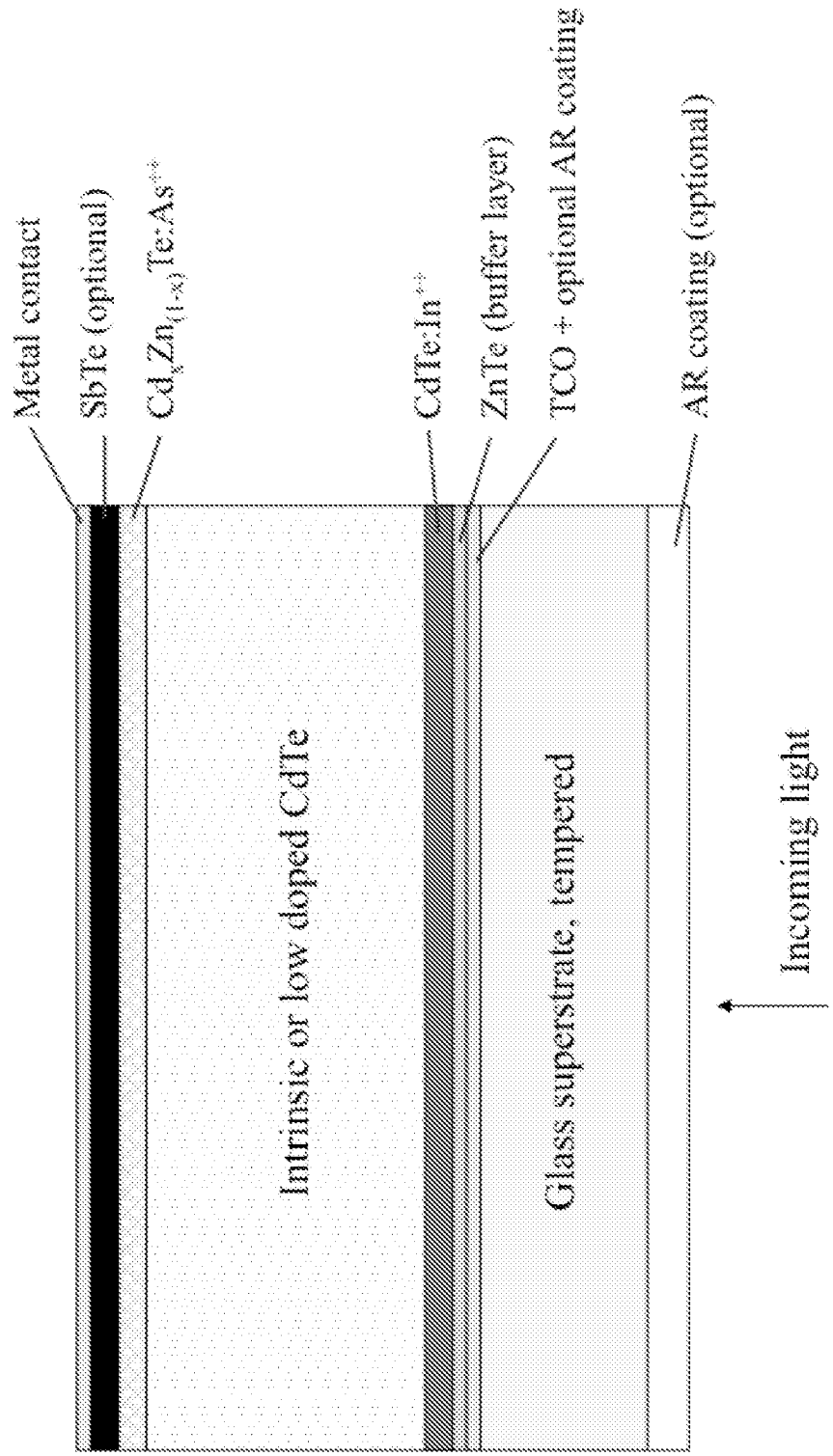
Figure 4. N-insulator-p junction solar cell

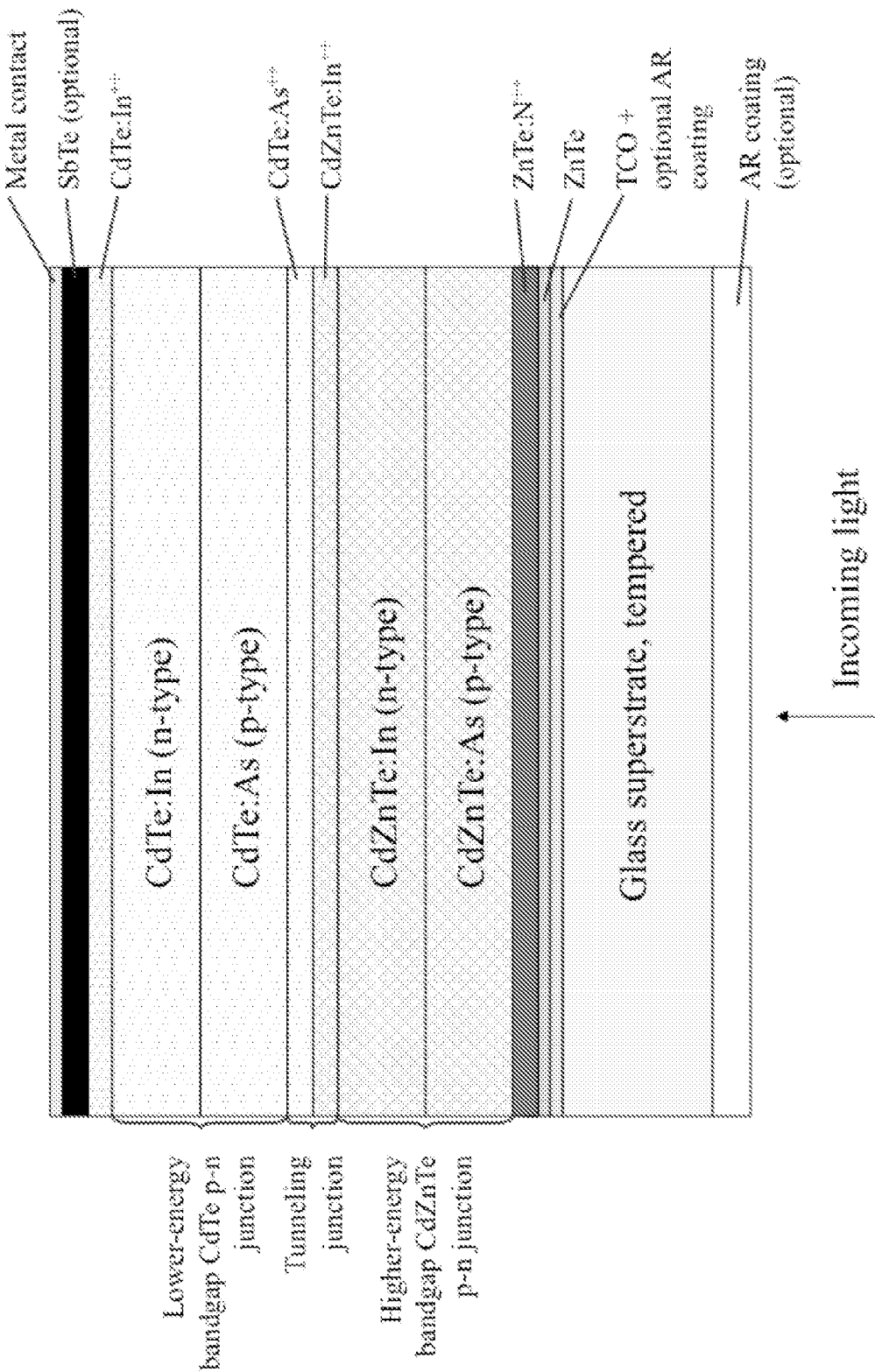

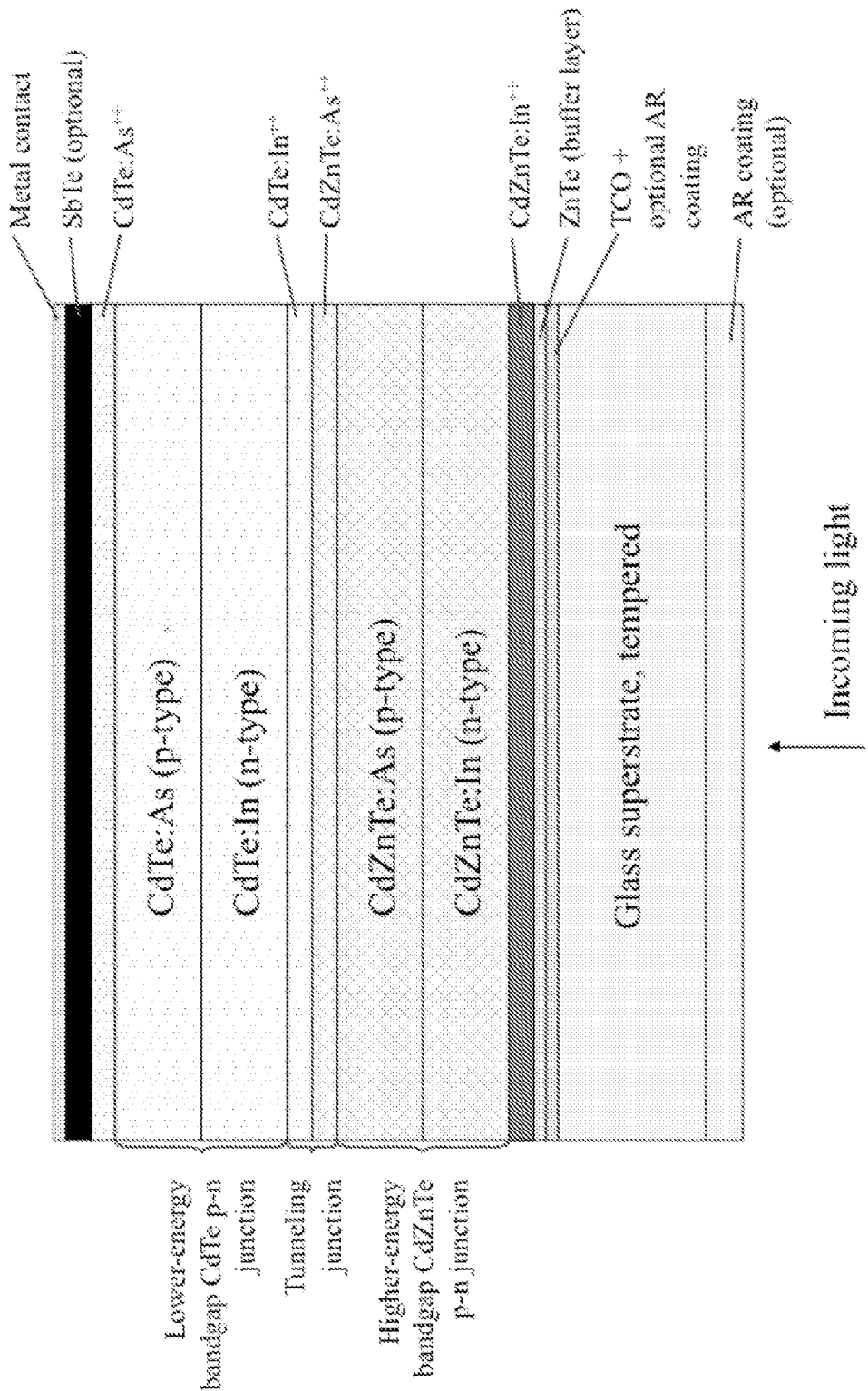

POLYCRYSTALLINE CDTE THIN FILM SEMICONDUCTOR PHOTOVOLTAIC CELL STRUCTURES FOR USE IN SOLAR ELECTRICITY GENERATION

CROSS-REFERENCE

This application is a Continuation Application of U.S. patent application Ser. No. 12/505,391, filed Jul. 17, 2009, which claims the benefit of U.S. Provisional Patent Application Ser. Nos. 61/081,625, filed Jul. 17, 2008, 61/082,759, filed Jul. 22, 2008, and 61/186,788, filed Jun. 12, 2009, all of which are incorporated herein by reference in their entirety.

FIELD OF THE INVENTION

The invention relates to cadmium telluride (CdTe) thin film semiconductor solar cell structures, more particularly to high efficiency polycrystalline CdTe thin film semiconductor solar cell structures grown by molecular beam epitaxy (MBE).

BACKGROUND OF THE INVENTION

A photovoltaic cell is able to absorb radiant light energy and convert it directly into electrical energy. Some photovoltaic ("PV") cells are employed as a measure of the ambient light in non-imaging applications or (in an array format) as imaging sensors in cameras to obtain an electrical signal for each portion of the image. Other photovoltaic cells are used to generate electrical power. Photovoltaic cells can be used to power electrical equipment for which it has proven difficult or inconvenient to provide a source of continuous electrical energy.

An individual photovoltaic cell has a distinct spectrum of light to which it is responsive. The particular spectrum of light to which a photovoltaic cell is sensitive is primarily a function of the material forming the cell. Photovoltaic cells that are sensitive to light energy emitted by the sun and are used to convert sunlight into electrical energy can be referred to as solar cells.

Individually, any given photovoltaic cell is capable of generating only a relatively small amount of power. Consequently, for most power generation applications, multiple photovoltaic cells are connected together in series into a single unit, which can be referred to as an array. When a photovoltaic cell array, such as a solar cell array, produces electricity, the electricity can be directed to various locations, such as, e.g., a home or business, or a power grid for distribution.

There are PV cells available in the art, but these can be costly to produce. In addition, PV cells available in the art might not provide a high conversion efficiency, from light to electricity, for a given quantity of light. Accordingly, there is a need in the art for improved PV cells and devices and methods for producing the same at lower production costs and higher conversion efficiency.

SUMMARY OF THE INVENTION

An aspect of the invention provides a process for forming high performance, single junction photovoltaic devices, comprising high deposition rate polycrystalline growth using molecular beam epitaxy ("MBE"). In an embodiment, the process further provides the capability to do the following: in situ superstrate (or substrate) temperature control; in situ doping of the p-n junction; in situ high doping; in situ thermal anneal; in situ grain boundary passivation by overpressure of suitable beam constituents; compositional grading during growth by flux level control of suitable beam constituents; high precision control over layer thicknesses; and high precision control over deposition growth rates. In an embodiment, for the process temperature ranges from about 150° C. to 425° C., or from about 200° C. to 400° C., or from about 250° C. to 350° C. can be accommodated.

In an embodiment, doping of p-n junctions can range from $1\times10^{16}$ cm$^{-3}$ to $1\times10^{18}$ cm$^{-3}$ for both p-type and n-type dopants. In another embodiment, high doping can range from $3\times10^{18}$ cm$^{-3}$ to $1\times10^{20}$ cm$^{-3}$ for both p-type and n-type dopants.

In an embodiment, for the process a thermal anneal range of about 25° C. to 125° C., or 50° C. to 100° C., above the superstrate deposition temperature can be accommodated. Overpressures of suitable beam constituents of about 10-30% above nominal pressure can be accommodated. In addition, flux levels of beam constituents can be varied stepwise or in a finer fashion from no flux to substantially high fluxes so as to provide the necessary growth rates. In an embodiment, for the process, layer thicknesses can be controlled at the 10 Å level of growth or better.

In an embodiment, growth rates can be varied stepwise or finer from about 0.3 microns per hour to 3 microns per hour. In another embodiment, growth rates can be varied stepwise or finer from about 6 microns per hour to 12 microns per hour. In another embodiment, growth rates can be varied stepwise or finer from about 18 microns per hour to 25 microns per hour or faster.

Another aspect of the invention provides polycrystalline p-n junction photovoltaic cell (also "photovoltaic cell" herein) structures having at least two layers of compound semiconductor materials, comprising ZnTe, MgTe, graded $Cd_xZn_{(1-x)}Te$, and CdTe. The structure can be grown on a superstrate with or without a transparent conductive oxide ("TCO") with successive semiconductor layers deposited to provide, in sequence, an optional thin buffer layer, a low ohmic, very high doped frontside connection layer, an n-p junction, and a low ohmic, high doped backside connection layer as the final semiconductor layer, followed by an optional in situ metallization.

In an embodiment, a heritage molecular beam epitaxy technique, or similar high vacuum, free-streaming flux of elements or reactive molecules can be operated in a mode of high deposition rate, 6-10 microns/hour, to produce polycrystalline material structure with a total thickness between about 1 micrometers ("microns") and 4 microns deposited onto an optically transparent superstrate, e.g., a conductive-oxide coated piece of glass (the "superstrate") at a deposition temperature between about 200° C. and 400° C. with superstrate area greater than 600 mm×600 mm.

In an embodiment of the device structure, an optional ZnTe or MgTe buffer layer of thickness less than or equal to about 200 Å can be deposited onto the superstrate at a deposition temperature between about 250° C. and 350° C. In an embodiment, a high doped layer of ZnTe of thickness less than about 200 Å can be deposited onto the buffer layer at a deposition temperature between about 250° C. and 350° C. The high doped layer of ZnTe can be doped in situ with nitrogen in excess of $1\times10^{19}$ cm$^{-3}$ to produce a p+ type material. A crystallizing anneal can be applied to the ZnTe layer(s) at an elevated temperature between about 50° C. and 100° C. above the deposition temperature for a time less than about 3 minutes.

In an embodiment, an n-p doped heterojunction of CdTe and CdZnTe of thickness between about 1.25 micrometers ("microns") and 4 microns can be deposited onto the ZnTe layer at a deposition temperature between about 250° C. and 350° C. CdTe can be first doped in situ with arsenic doping concentration in the range $1\times10^{17}$ and $4\times10^{17}$ cm$^{-3}$ to produce a p-type material at a thickness between about 1 microns and 3 microns. In an alternative embodiment, for the first 200-500 Å the arsenic doping concentration is between about $1\times10^{18}$ and $3\times10^{18}$ cm$^{-3}$ and then ramped down to the range $1\times10^{17}$ to $4\times10^{17}$ cm$^{-3}$. CdZnTe can next be doped in situ with indium in the range $1\times10^{18}$ and $4\times10^{18}$ cm$^{-3}$ to produce an n-type material at a thickness between about 0.25 microns and 1 microns. The $Cd_xZn_{(1-x)}Te$ is compositionally graded from x=1 down to an x value between about 0.6 and 0.75. A crystallizing anneal can be applied to the CdTe/CdZnTe layers at an elevated temperature between about 50° C. and 100° C. above the deposition temperature and under Cd overpressure for a time less than about 3 minutes. The anneal can be performed more than once during the deposition of the layers for a total time less than about 10 minutes at thickness steps between about 0.4 microns and 0.6 microns, followed by a return to the deposition temperature and continuation of the deposition.

In an embodiment, a second, high doped CdZnTe layer is deposited onto the first CdZnTe layer with thickness less than or equal to about 200 Å at a deposition temperature between about 250° C. and 350° C. The second CdZnTe layer can be doped with indium between about $1\times10^{19}$ and $1\times10^{20}$ cm$^{-3}$ to produce an n+ type, ohmic material for metal contact.

In an embodiment, a metal contact is deposited onto the photovoltaic cell in situ with thickness on the order of 10,000 Å. The photovoltaic cell deposited (or formed) on the superstrate can be transferred in vacuum from the primary semiconductor deposition chamber to a second chamber for metal deposition under vacuum.

In another embodiment of the device structure, an optional ZnTe or MgTe buffer layer of thickness less than or equal to about 200 Å can be deposited onto the superstrate at a deposition temperature between about 250° C. and 350° C. In an embodiment, a high doped layer of ZnTe of thickness less than about 200 Å can be deposited onto the buffer layer at a deposition temperature between about 250° C. and 350° C. The high doped layer of ZnTe layer can be doped in situ with nitrogen in excess of $1\times10^{19}$ cm$^{-3}$ to produce a p+ type material. A crystallizing anneal can be applied to the ZnTe layers at an elevated temperature between about 50° C. and 100° C. above the deposition temperature for a time less than about 3 minutes.

In an embodiment, an intrinsic (undoped or very low doped) CdTe (i-CdTe) layer of thickness between about 1.0 micrometer ("micron") and 1.5 microns can be deposited onto the ZnTe layer at a deposition temperature between about 250° C. and 350° C. A crystallizing anneal can be applied to the i-CdTe layer at an elevated temperature between about 50° C. and 100° C. above the deposition temperature and under Cd overpressure for a time less than about 3 minutes. The anneal can be performed more than once during the deposition of the layer for a total time less than about 10 minutes at thickness steps between about 0.4 microns and 0.6 microns, followed by a return to the deposition temperature and continuation of the deposition.

In an embodiment, a high doped $Cd_xZn_{(1-x)}Te$ layer is deposited onto the i-CdTe layer with thickness less than or equal to about 200 Å at a deposition temperature between about 250° C. and 350° C. The CdZnTe layer can be doped with indium between about $1\times10^{19}$ and $1\times10^{20}$ cm$^{-3}$ to produce an n+ type, ohmic material for metal contact. In a preferred embodiment x=1.

In an embodiment, a metal contact is deposited onto the photovoltaic cell in situ with thickness on the order of 10,000 Å. The photovoltaic cell deposited (or formed) on the superstrate can be transferred in vacuum from the primary semiconductor deposition chamber to a second chamber for metal deposition under vacuum.

In yet another embodiment of the device structure, an optional ZnTe or MgTe buffer layer of thickness less than or equal to about 200 Å can be deposited onto the superstrate at a deposition temperature between about 250° C. and 350° C. In an embodiment, a high doped layer of CdTe of thickness less than about 200 Å can be deposited onto the buffer layer at a deposition temperature between about 250° C. and 350° C. The high doped layer of CdTe layer can be doped in situ with indium in excess of $1\times10^{19}$ cm$^{-3}$ to produce a n+ type material. A crystallizing anneal can be applied to the ZnTe(or MgTe)/CdTe layers at an elevated temperature between about 50° C. and 100° C. above the deposition temperature for a time less than about 3 minutes and under Cd overpressure for the CdTe layer.

In an embodiment, an n-p doped heterojunction of CdTe first and CdZnTe second of total thickness between about 1.25 micrometers ("microns") and 4 microns can be deposited onto the CdTe layer at a deposition temperature between about 250° C. and 350° C. The CdTe layer can be doped in situ with indium in the range $1\times10^{17}$ and $4\times10^{17}$ cm$^{-3}$ to produce an n-type material at a thickness between about 1 microns and 3 microns. CdZnTe can next be doped in situ with arsenic in the range $0.5\times10^{18}$ and $1\times10^{18}$ cm$^{-3}$ to produce a p-type material at a thickness between about 0.25 microns and 1 microns. The $Cd_xZn_{(1-x)}Te$ is compositionally graded from x=1 down to an x value between about 0.6 and 0.75. A crystallizing anneal can be applied to the CdTe/CdZnTe layers at an elevated temperature between about 50° C. and 100° C. above the deposition temperature under Cd overpressure for a time less than about 3 minutes. The anneal can be performed more than once during the deposition of the layers for a total time less than about 10 minutes at thickness steps between about 0.4 microns and 0.6 microns, followed by a return to the deposition temperature and continuation of the deposition.

In an embodiment, a second, high doped $Cd_xZn_{(1-x)}Te$ layer is deposited onto the first CdZnTe layer with thickness less than or equal to about 200 Å at a deposition temperature between about 250° C. and 350° C. The second CdZnTe layer can be doped with arsenic between about $1\times10^{18}$ and $5\times10^{18}$ cm$^{-3}$ to produce a p+ type, ohmic material for metal contact. In an alternative embodiment x=0 (ZnTe) and the dopant is nitrogen between about $1\times10^{19}$ and $1\times10^{20}$ cm$^{-3}$ to produce a p+ type, ohmic material for metal contact.

In an embodiment, a metal contact is deposited onto the photovoltaic cell in situ with thickness on the order of 10,000 Å. The photovoltaic cell deposited (or formed) on the superstrate can be transferred in vacuum from the primary semiconductor deposition chamber to a second chamber for metal deposition under vacuum.

In another embodiment of the device structure, an optional ZnTe or MgTe buffer layer of thickness less than or equal to about 200 Å can be deposited onto the superstrate at a deposition temperature between about 250° C. and 350° C. In an embodiment, a high doped layer of CdTe of thickness less than about 200 Å can be deposited onto the buffer layer at a deposition temperature between about 250° C. and 350° C. The high doped layer of CdTe layer can be doped in situ with indium in excess of $1\times10^{19}$ cm$^{-3}$ to produce a n+ type material. A crystallizing anneal can be applied to the ZnTe(or MgTe)/CdTe layers at an elevated temperature between about 50° C. and 100° C. above the deposition temperature for a time less than about 3 minutes and under Cd overpressure for the CdTe layer.

In an embodiment, an intrinsic (undoped or very low doped) CdTe (i-CdTe) layer of thickness between about 1.0 micrometers ("microns") and 1.5 microns can be deposited onto the CdTe layer at a deposition temperature between about 250° C. and 350° C. A crystallizing anneal can be applied to the i-CdTe layer at an elevated temperature between about 50° C. and 100° C. above the deposition temperature under Cd overpressure for a time less than about 3 minutes. The anneal can be performed more than once during the deposition of the layer for a total time less than about 10 minutes at thickness steps between about 0.4 microns and 0.6 microns, followed by a return to the deposition temperature and continuation of the deposition.

In an embodiment, a high doped $Cd_xZn_{(1-x)}Te$ layer is deposited onto the i-CdTe layer with thickness less than or equal to about 200 Å at a deposition temperature between about 250° C. and 350° C. The CdZnTe layer can be doped with arsenic between about $1\times10^{18}$ and $5\times10^{18}$ $cm^{-3}$ to produce a p+ type, ohmic material for metal contact. In an alternative embodiment x=0 (ZnTe) and the dopant is nitrogen between about $1\times10^{19}$ and $1\times10^{20}$ $cm^{-3}$ to produce a p+ type, ohmic material for metal contact.

In an embodiment, a metal contact is deposited onto the photovoltaic cell in situ with thickness on the order of 10,000 Å. The photovoltaic cell deposited (or formed) on the superstrate can be transferred in vacuum from the primary semiconductor deposition chamber to a second chamber for metal deposition under vacuum.

In yet another embodiment of the device structure, i.e., a "tandem" junction structure, an optional ZnTe or MgTe buffer layer of thickness less than or equal to about 200 Å can be deposited onto the superstrate at a deposition temperature between about 250° C. and 350° C. In an embodiment, a high doped layer of ZnTe of thickness less than about 200 Å can be deposited onto the buffer layer at a deposition temperature between about 250° C. and 350° C. The high doped layer of ZnTe layer can be doped in situ with nitrogen in excess of $1\times10^{19}$ $cm^{-3}$ to produce a p+ type material. A crystallizing anneal can be applied to the ZnTe layers at an elevated temperature between about 50° C. and 100° C. above the deposition temperature for a time less than about 3 minutes.

In an embodiment, an n-p doped higher energy band-gap (visible) homojunction of CdZnTe of thickness between about 0.5 micrometers ("microns") and 1.25 microns can be deposited onto the ZnTe layer at a deposition temperature between about 250° C. and 350° C. CdZnTe can be first doped in situ with arsenic in the range $1\times10^{17}$ and $4\times10^{17}$ $cm^{-3}$ to produce a p-type material at a thickness between about 0.25 microns and 0.75 microns. In an alternative embodiment, for the first 200-500 Å the arsenic doping concentration is between about $1\times10^{18}$ and $3\times10^{18}$ $cm^{-3}$ and then ramped down to the range $1\times10^{17}$ to $4\times10^{17}$ $cm^{-3}$. CdZnTe can next be doped in situ with indium in the range $1\times10^{18}$ and $4\times10^{18}$ $cm^{-3}$ to produce an n-type material at a thickness between about 0.25 microns and 0.5 microns. A crystallizing anneal can be applied to the CdZnTe layers at an elevated temperature between about 50° C. and 100° C. above the deposition temperature and under Cd and optionally Zn overpressure for a time less than about 3 minutes. The anneal can be performed more than once during the deposition of the layers for a total time less than about 10 minutes at thickness steps between about 0.4 microns and 0.6 microns, followed by a return to the deposition temperature and continuation of the deposition.

In an embodiment, a high doped tunneling junction (p-n junction) is deposited to provide electrical connection between the higher energy band gap n-p CdZnTe junction and a lower energy band gap n-p CdTe junction disposed over the higher energy band gap n-p CdZnTe layer. The p-n tunneling junction comprises a high doped n+ CdZnTe layer of the same composition as the n-type CdZnTe layer below, with a thickness less than about 100 Å and indium dopant concentration greater than or equal to about $5\times10^{19}$ $cm^{-3}$. The tunneling junction further comprises a high doped p+ CdTe over the n+ CdZnTe layer, the p+ CdTe layer having a thickness less than about 50 Å and an arsenic dopant concentration greater than or equal to about $3\times10^{18}$ $cm^{-3}$.

In an embodiment, an n-p doped lower energy band gap (near infrared) homojunction of CdTe of thickness between about 1.0-1.5 microns is deposited onto the tunneling junction at a deposition temperature between about 250° C.-350° C. During formation of the n-p doped CdTe layer, CdTe can first be doped in situ with arsenic in the range of about $1\times10^{17}$-$4\times10^{17}$ $cm^{-3}$ to produce a p-type material at a thickness between about 0.75-1 micron, and next doped in situ with indium in the range $1\times10^{18}$-$4\times10^{18}$ $cm^{-3}$ to produce an n-type material at a thickness between about 0.25-0.5 micron. An optional crystallizing anneal can be applied to the CdTe layers at an elevated temperature between about 50° C. and 100° C. above the deposition temperature and under Cd overpressure for a time less than about 3 minutes. The anneal can be performed more than once during the deposition of the layers for a total time less than about 10 minutes at thickness steps between about 0.4 microns and 0.6 microns, followed by a return to the deposition temperature and continuation of the deposition.

In an embodiment, a second, high doped CdTe layer is deposited onto the first CdTe layer with thickness less than or equal to about 200 Å at a deposition temperature between about 250° C. and 350° C. The second CdTe layer can be doped with indium between about $1\times10^{19}$ and $1\times10^{20}$ $cm^{-3}$ to produce an n+ type, ohmic material for metal contact.

In an embodiment, a metal contact is deposited onto the photovoltaic cell in situ with thickness on the order of 10,000 Å. The photovoltaic cell deposited (or formed) on the superstrate can be transferred in vacuum from the primary semiconductor deposition chamber to a second chamber for metal deposition under vacuum.

In another embodiment of the device structure, i.e., another "tandem" junction structure, an optional ZnTe or MgTe buffer layer of thickness less than or equal to about 200 Å can be deposited onto the superstrate at a deposition temperature between about 250° C. and 350° C. In an embodiment, a high doped layer of CdZnTe of thickness less than about 200 Å can be deposited onto the buffer layer at a deposition temperature between about 250° C. and 350° C. The high doped layer of CdZnTe can be doped with indium between about $1\times10^{19}$ and $1\times10^{20}$ $cm^{-3}$ to produce an n+ type, ohmic material. A crystallizing anneal can be applied to the CdZnTe layers at an elevated temperature between about 50° C. and 100° C. above the deposition temperature under Cd overpressure for a time less than about 3 minutes.

In an embodiment, an n-p doped higher energy band-gap (visible) homojunction of CdZnTe of thickness between about 0.5 micrometers ("microns") and 1.25 microns can be deposited onto the CdZnTe layer at a deposition temperature between about 250° C. and 350° C. CdZnTe can be first doped in situ with indium in the range $1\times10^{17}$ and $4\times10^{17}$ $cm^{-3}$ to produce an n-type material at a thickness between about 0.25 microns and 0.75 microns. CdZnTe can next be doped in situ with arsenic in the range $0.5\times10^{18}$ and $1\times10^{18}$ $cm^{-3}$ to produce a p-type material at a thickness between about 0.25 microns and 0.5 microns. A crystallizing anneal can be applied to the CdZnTe layers at an elevated temperature between about 50° C. and 100° C. above the deposition temperature under Cd and optionally Zn overpressure for a time less than about 3 minutes. The anneal can be performed more than once during the deposition of the layers for a total time less than about 10 minutes at thickness steps between about 0.4 microns and 0.6 microns, followed by a return to the deposition temperature and continuation of the deposition.

In an embodiment, a high doped tunneling junction (p-n junction) is deposited to provide electrical connection between the higher energy band gap n-p CdZnTe junction and a lower energy band gap n-p CdTe junction disposed over the higher energy band gap n-p CdZnTe layer. The p-n tunneling junction comprises a high doped p+ CdZnTe layer of the same composition as the p-type CdZnTe layer below, with a thickness less than about 50 Å and arsenic dopant concentration greater than or equal to about $3\times10^{18}$ cm$^{-3}$. The tunneling junction further comprises a high doped n+ CdTe over the p+ CdZnTe layer, the n+ CdTe layer having a thickness less than about 100 Å and an indium dopant concentration greater than or equal to about $5\times10^{19}$ cm$^{-3}$.

In an embodiment, an n-p doped lower energy band gap (near infrared) layer of CdTe of thickness between about 1.0-1.5 microns is deposited onto the tunneling junction at a deposition temperature between about 250° C.-350° C. During formation of the n-p doped CdTe layer, CdTe layer can be first doped in situ with indium in the range of about $1\times10^{17}$-$4\times10^{17}$ cm$^{-3}$ to produce an n-type material at a thickness between about 0.75-1 micron, and next doped in situ with arsenic in the range $0.5\times10^{18}$ cm$^{-3}$ to produce a p-type material at a thickness between about 0.25-0.5 micron. An optional crystallizing anneal can be applied to the CdTe layers at an elevated temperature between about 50° C. and 100° C. above the deposition temperature under Cd overpressure for a time less than about 3 minutes. The anneal can be performed more than once during the deposition of the layers for a total time less than about 10 minutes at thickness steps between about 0.4 microns and 0.6 microns, followed by a return to the deposition temperature and continuation of the deposition.

In an embodiment, a second, high doped CdTe layer is deposited onto the first CdTe layer with thickness less than or equal to about 200 Å at a deposition temperature between about 250° C. and 350° C. The second CdTe layer can be doped with arsenic between about $1\times10^{18}$ and $5\times10^{18}$ cm$^{-3}$ to produce a p+ type, ohmic material for metal contact.

In an embodiment, a metal contact is deposited onto the photovoltaic cell in situ with thickness on the order of 10,000 Å. The photovoltaic cell deposited (or formed) on the superstrate can be transferred in vacuum from the primary semiconductor deposition chamber to a second chamber for metal deposition under vacuum.

In an aspect of the invention, a photovoltaic device is provided, the PV device comprising a first layer comprising tellurium (Te) and cadmium (Cd) or zinc (Zn) over a substrate; a second layer comprising Cd and Te over the first layer; and a third layer comprising Cd, Zn and Te over the second layer.

In another aspect of the invention, a PV device is provided, the PV device comprising a p-type ZnTe layer over a substrate; a p-type CdTe layer over the p-type ZnTe layer; a first n-type CdZnTe layer over the p-type CdTe; and a second n-type CdZnTe layer over the first n-type CdZnTe layer.

In yet another aspect of the invention, a PV device is provided, the PV device comprising an n-type layer including Cd and Te; an intrinsic CdTe layer over the n-type layer; and a p-type layer including Te and one or more of Cd and Zn over the intrinsic CdTe layer. In an embodiment, the PV device further comprising a substrate below the n-type layer. In an alternative embodiment, the PV device comprises a substrate above the p-type layer.

In still another aspect of the invention, a PV device is provided, the PV device comprising a first n-type CdTe layer over a substrate; a second n-type CdTe layer over the first n-type CdTe layer; a first p-type CdZnTe layer over the second n-type CdTe layer; and a second p-type CdZnTe layer over the first p-type CdZnTe layer.

In still another aspect of the invention, a photovoltaic device is provided, the PV device comprising an intrinsic CdTe layer between an n-type layer having Cd and Te and a p-type layer having Zn and Te, wherein the n-type layer is disposed below the intrinsic CdTe layer. In an embodiment, the PV device comprises a substrate or superstrate below the n-type layer. In an alternative embodiment, the PV device comprises a substrate or superstrate above the p-type layer.

BRIEF DESCRIPTION OF THE DRAWINGS

The novel features of the invention are set forth with particularity in the appended claims. A better understanding of the features and advantages of the invention will be obtained by reference to the following detailed description that sets forth illustrative embodiments, in which the principles of the invention are utilized, and the accompanying drawings of which:

FIG. 1 shows a "reverse" p-n junction solar cell structure, in accordance with an embodiment of the invention;

FIG. 2 shows a "reverse" p-intrinsic-n solar cell structure, in accordance with an embodiment of the invention;

FIG. 3 shows an n-p junction solar cell structure, in accordance with an embodiment of the invention; and FIG. 4 shows an n-intrinsic-p junction solar cell structure, in accordance with an embodiment of the invention;

FIG. 5 shows a "reverse" tandem junction solar cell structure, in accordance with an embodiment of the invention; and FIG. 6 shows a tandem junction solar cell structure, in accordance with an embodiment of the invention.

DETAILED DESCRIPTION OF THE INVENTION

While various embodiments of the invention have been shown and described herein, it will be obvious to those skilled in the art that such embodiments are provided by way of example only. Numerous variations, changes, and substitutions will now occur to those skilled in the art without departing from the invention. It should be understood that various alternatives to the embodiments of the invention described herein may be employed in practicing the invention.

In current thin film photovoltaic cells, such as CdTe or CIGS, a CdS "window" layer is used because it is an intrinsically n-type material. Because current process technologies used in production do not provide the capability of doping photovoltaic structures in situ (i.e., real time in the deposition chamber), those of skill in the art use a material with high intrinsic n-type doping, such as CdS, to define the n-type layer of the p-n junction. But there are limitations associated with using CdS. For example, CdS (at a CdS/CdTe interface) can reduce useable electrical current by absorbing incoming photons, which in turn create charge carriers that contribute very little, if at all, to the electrical current of the diode. In some cases, this problem is due to a combination of a band gap barrier between the CdS/CdTe layers and large recombination rates at a low quality CdS/CdTe interface layer. In overcoming these limitations, one approach is to reduce the thickness of the CdS light absorbing layer as much as possible to limit the amount of incoming light that is absorbed in this "dead layer." But below about 100 nanometers, the CdS layer has pinholes and non-uniformities that degrade device performance.

In various embodiments, methods for forming cadmium telluride (CdTe) thin film solar cell structures are provided. Methods of embodiments provide for forming high quality CdTe thin films at high deposition rates. CdTe thin film structures of preferable embodiments can provide for high power efficiency conversion in solar cell (also "photovoltaic cell" or "photovoltaic" herein) devices.

Methods of preferable embodiments are suitable for forming solar panels using molecular beam epitaxy ("MBE") at high deposition rates and polycrystalline deposition modes, while still providing the advantages of doping, composition and uniformity control of MBE. Methods of various embodiments enable formation of single and tandem junction solar cell structures having uniform compositions, longer lifetime, and larger grain sizes, which provide for enhanced device performance.

In preferable embodiments, doping of structural layers of solar cell devices with shallow donors and acceptors is performed in situ (i.e., during deposition) during epitaxial growth of solar cell device structural layers. Conventional chemical vapor deposition techniques (other than MBE) suffer from low solubility issues with the shallow level donors/acceptors or difficulty with complete ionization for deeper level donors/acceptors. By doping the structure in situ the solubility issues are overcome and hence the technique allows the use of the shallow donor/acceptors to provide high doping levels, necessary to build improved performance solar cells. This advantageously reduces, if not eliminates, interstitial or intrinsic (defect) dopants by providing substitutional dopants. Substitutional dopants can provide for more stable solar cell devices because of their much lower diffusion compared to interstitial dopants. MBE methods of preferable embodiments can advantageously provide for forming high quality thin film solar cell devices with higher power efficiency in relation to prior art thin film solar cell devices.

Methods and structure of embodiments of the invention can provide photovoltaic devices with improved short circuit current (Jsc), open circuit voltage (Voc), and fill factor (FF) in relation to prior art thin film photovoltaic devices. In one embodiment, a "reverse" p-n junction ("reverse" from the point of view of the current technologies which deposit the n-type portion of the junction on the superstrate and follow with deposition of the p-type portion of the junction; in this embodiment, that order is reversed with the p-type portion deposited on the superstrate first, followed by the n-type portion of the junction which now makes contact to the backside metallization) photovoltaic device having a power efficiency between about 18% and 22% is achievable. In another embodiment, a "reverse" n-intrinsic-p junction photovoltaic device having a power efficiency between about 18% and 22% is achievable. In another embodiment, an n-p junction photovoltaic device having a power efficiency between about 18% and 22% is achievable. In another embodiment, an n-intrinsic-p junction photovoltaic device having a power efficiency between about 18% and 22% is achievable. In another embodiment, a tandem junction photovoltaic device having a power efficiency between about 24% and 28% is achievable.

Thin film solar cell structures of preferable embodiments can be formed in one or more in-line vacuum chambers configured for molecular beam epitaxy ("MBE"). The one or more vacuum chambers may include a primary molecular beam ("MB") chamber and one or more in-line auxiliary (or secondary) chambers. The vacuum chambers can be maintained under medium vacuum ($1\times10^{-6}$ to $1\times10^{-5}$ torr, or $1\times10^{-7}$ to $1\times10^{-6}$ torr) or high vacuum ($1\times10^{-8}$ to $1\times10^{-7}$ torr) during operation with the aid of a pumping system comprising one or more of an ion pump, a turbomolecular ("turbo") pump, a cryopump and a diffusion pump. The pumping system may also include one or more "backing" pumps, such as mechanical or dry scroll pumps. Vacuum chambers of preferable embodiments may include a main deposition chamber for forming various device structures, in addition to auxiliary chambers for forming additional device structures, such as, e.g., backside metal contact ("metallization") and solar panel laser cell scribing. In an alternative embodiment, multiple in-line vacuum chambers can be arranged to provide particular layer depositions of the overall device structure, with increases in overall through-put. Molecular beam systems of preferable embodiments may comprise one or more vacuum chambers, pumping systems and a computer system configured to control vacuum chamber pressure, substrate temperature, material source temperatures, and various parameters (e.g., source partial pressure, source flux, deposition time, exposure time) associated with the deposition of solar cell device structures.

This deposition method applies to any vacuum deposition technique that can (i) control the doping as the material is grown (in situ), (ii) control the thicknesses of different compositional layers, (iii) control the deposition rate during growth, and (iv) control the compositional change from one layer to another layer by varying the ratio of elements in the composition. This includes, but is not limited to, conventional (solid phase) MBE, gas phase MBE (GPMBE), and metalorganic chemical vapor deposition (MOCVD), and any other vapor deposition that meets the above requirements, especially requirements (i)-(iii). In a preferable embodiment, the MBE approach is employed.

In embodiments of the invention, methods, apparatuses and/or structures provide for the following: (i) polycrystalline growth at high deposition rate; (ii) cell architectures that remove the problematic CdS "window" layer; (iii) deposition with complete doping control, in situ, to optimize the cell structure with respect to doping concentrations; (iv) compositional grading of heterojunction layers to optimize the cell structure by significant reduction in interface recombination sites; (v) the capability to heavily dope material grown over a superstrate (or substrate), in situ, near front and back contacts to create one or more low ohmic contacts; (vi) providing passivation of grain boundaries, in situ, by heavily doping the grain boundaries to repel minority carriers from the boundary recombination sites; and (vii) providing complete deposition rate control to allow deposition interruption for crystallizing anneals, in situ, and allowing highly reduced growth rate for the initial seed layers in order to optimize grain size. In embodiments, capabilities (iii) and (iv) above, when combined, allow for complete control over the position of the junction for the heterostructure for optimized performance, which is achieved by placing the junction substantially near the narrower band-gap material.

As used herein, "n-type layer" refers to a layer having an n-type chemical dopant and "p-type layer" refers to a layer having a p-type chemical dopant. N-type layers and p-type layers can have other materials in addition to n-type and p-type dopants. For example, an n-type CdTe layer is a layer formed of Cd and Te that is also chemically doped n-type. As another example, a p-type ZnTe layer is a layer having Zn and Te that is also chemically doped p-type.

Reverse p-n and $p^+$-Intrinsic-$n^+$ Junction Solar Cell Structures

In an aspect of the invention, a "reverse" p-n junction solar cell (or photovoltaic) device is grown by MBE on a superstrate, with or without a transparent conductive oxide (TCO). In a preferable embodiment, the highly doped front layer of the device structure serves as the front side low ohmic contact and a TCO coating is unnecessary since deposition can occur directly onto the bare glass superstrate. The successive semiconductor layers grown provide, in sequence: an optional thin buffer layer; a thin, high doped p-type, low ohmic contact layer; a p-n junction; a thin, high doped n-type, low ohmic layer; and an optional low ohmic "semimetal" contact (e.g., HgTe or SbTe). A metal contact is provided at the backside of the structure. The metal contact, along with the concomitant laser cell scribing, may be formed via in situ metallization and scribing.

In some embodiments, the solar cell structure may have at least 3 layers of different compound semiconductor materials. In some instances, those semiconductor materials may comprise ZnTe, MgTe, x-graded $Cd_xZn_{1-x}Te$, and CdTe. The reverse p-n junction solar cell structure may optionally include an SbTe ($Sb_2Te_3$) or HgTe layer for providing contact to a metal contact at the backside of the p-n junction solar cell structure (also "the structure" herein).

With reference to FIG. 1, a reverse p-n junction photovoltaic ("PV") cell (also "solar cell" herein) structure comprises a p-type (i.e., doped p-type) CdTe layer over a superstrate and an n-type (i.e., doped n-type) $Cd_xZn_{1-x}Te$ layer over the p-type CdTe layer. The n-type $Cd_xZn_{1-x}Te$ layer and the p-type CdTe layer define a p-n heterojunction (or structure) of the "reverse" p-n junction PV cell. In an embodiment, the p-n layer is formed of polycrystalline CdTe homojunction, with 'x' equal to 1, or CdTe/$Cd_xZn_{1-x}Te$ heterojunction with 'x' between about 0.60 and 0.75. The p-type CdTe layer and the n-type $Cd_xZn_{1-x}Te$ layer define the light-absorbing layers of the PV cell with the p-type CdTe layer thickness sufficient to absorb a large majority (greater than about 90%) of the incoming light.

The reverse p-n junction PV cell may include an optional, thin intrinsic (i.e., undoped or very low doped) resistive ZnTe or MgTe layer between the superstrate (with or without TCO) and the p-type CdTe layer. A thin, high doped p-type ZnTe (i.e., p+ ZnTe) layer may be provided between the optional resistive ZnTe layer and the p-type CdTe layer.

The reverse p-n junction PV cell may further include a metal contacting layer over the n-type $Cd_xZn_{1-x}Te$ layer. To improve electrical contact between the metal contact and the n-type $Cd_xZn_{1-x}Te$ layer, a thin, high doped n-type $Cd_xZn_{1-x}Te$ (i.e., n+ $Cd_xZn_{1-x}Te$) layer may be provided between the n-type $Cd_xZn_{1-x}Te$ layer and the metal contact. For further improvement in electrical contact between the metal contact and the n-type $Cd_xZn_{1-x}Te$ layer, a thin, SbTe or HgTe layer may be provided between the n-type thin, high doped $Cd_xZn_{1-x}Te$ layer (n+ $Cd_xZn_{1-x}Te$) and the metal contact, or, alternative, between the n-type $Cd_xZn_{1-x}Te$ layer and the metal contact.

With continued reference to FIG. 1, the reverse p-n junction solar cell can further include an antireflective ("AR") coating layer at the superstrate frontside (where light enters the reverse p-n junction solar cell) and/or between the superstrate and the transparent conductive oxide, if present, or the first structure layer, if absent. The AR layer can aid in minimizing reflection of light incident on the reverse p-n junction solar cell. The reverse p-n junction solar cell can further include an antireflective ("AR") coating layer (or layers on each side of the superstrate) that is configured to reflect certain wavelengths of light and absorb certain wavelengths of light so as to provide an esthetically appealing custom color to the visible surface of the solar panel (i.e., solar panel art or architectural appeal).

With continued reference to FIG. 1, one or more electrical contacts are provided at the frontside (superstrate). In an embodiment, an etch is used to access the frontside (superstrate) transparent conductive oxide, if present, or the high doped contact layer, if absent, to form the electrical contact at the frontside. In another embodiment, laser scribing is used to access the frontside (superstrate) conducting layer to form the electrical contact at the frontside.

With reference to FIG. 2, in an alternative embodiment, an intrinsic (or very low doped) CdTe (i.e., i-CdTe) layer is provided on the high doped p+ ZnTe layer, and the high doped n+ $Cd_xZn_{1-x}Te$ layer is formed over the i-CdTe layer. In such a case, the i-CdTe partially defines the p-intrinsic-n CdTe structure of a p-intrinsic-n junction solar cell device. The i-CdTe layer can be formed of polycrystalline CdTe. In a preferred embodiment, the i-CdTe layer has a thickness between about 1.0 and 1.5 microns. The i-CdTe layer can be deposited at a deposition temperature between about 200° C. and about 400° C., or between about 250° C. and about 350° C. Following formation of the i-CdTe (light-absorbing) layer, an optional crystallizing and grain boundary passivating anneal can be performed at a temperature difference between about 25° C. and 125° C., or between about 50° C. and 100° C. above the i-CdTe deposition temperature. The crystallizing and grain boundary passivating anneal can be performed for a time period less than or equal to about 10 minutes, or less than or equal to about 5 minutes, or less than or equal to about 3 minutes.

In a preferable embodiment, the crystallizing and grain boundary passivating anneal is performed under a Cd overpressure. In such a case, all other sources of material flux are closed off during the passivating anneal. In another embodiment, the crystallizing and grain boundary passivating anneal is performed under a Cd and Zn overpressure. In such a case, all other sources of material flux are closed off during this anneal. In an embodiment, the crystallizing and grain boundary passivating anneal is performed more than once and at predetermined intervals during formation of the i-CdTe light-absorbing layer. The crystallizing and grain boundary passivating anneal can be performed at i-CdTe light-absorbing layer thickness steps between about 0.2 microns and about 0.8 micron, or between about 0.4 microns and about 0.6 microns, for a time period less than or equal to about 3 minutes, or less than or equal to about 2 minutes, or less than or equal to about 1 minute per anneal, followed by a return (of the superstrate) to the deposition temperature and continuation of the deposition of the i-CdTe light absorbing layer.

One or more of the layers discussed herein, in relation to various embodiments of the invention, may be optional. In some embodiments, the layers may be provided as described, while in other embodiments some variation in sequence may be provided (e.g., switching the sequence of layers CdTe/CdZnTe for the p-n heterojunction). Neighboring layers that differ in compositional structure by addition (and/or removal) of an element (e.g., a CdTe adjacent a ZnTe layer, or a CdTe layer adjacent a $Cd_xZn_{1-x}Te$ layer) may be graded between the two compositions by varying the mole fraction 'x' to ameliorate band-gap barriers that arise from directly depositing two different band-gap materials next to each other. This grading will occur over a thickness between about 0.1 microns and 0.5 microns.

With reference to FIG. 1, in a preferable embodiment, a reverse p-n junction solar cell structure is shown. The reverse p-n junction solar cell structure may comprise a highly resistive, thin film ZnTe or MgTe buffer layer on a superstrate ("Glass superstrate, tempered," as illustrated), and a thin, high doped p-type ZnTe layer over the thin resistive ZnTe (or MgTe) buffer layer. The superstrate can be formed of a semiconductor material or an amorphous material such as, e.g., standard soda lime glass. An optional transparent conductive oxide (TCO) layer can be provided over the superstrate to provide an electrical front contact. Alternatively a thin metal foil substrate can be used with the cell structure embodiments grown in reverse order so the incoming light continues to see the same layer sequence as with a superstrate. The final deposition layer in this sequence must be a transparent conductive oxide deposited in an in-line chamber next to the primary deposition chamber or the high doped contact layer of the device structure itself. The highly resistive buffer layer can have a thickness less than or equal to about 300 Å, or less than or equal to about 200 Å, or less than or equal to about 100 Å. The high doped p-type ZnTe layer can have a thickness less than or equal to about 300 Å, or less than or equal to about 200 Å, or less than or equal to about 100 Å. The two layers can each be deposited on the superstrate at a deposition temperature between about 200° C. and about 400° C., or between about 250° C. and about 350° C. In a preferable embodiment, the two layers are formed via molecular beam epitaxy ("MBE") at a growth rate about 1 Å per second.

In a preferable embodiment, the high doped ZnTe layer is doped in situ with nitrogen to produce a p+ material layer having a nitrogen dopant concentration between about $1 \times 10^{19}$ cm$^{-3}$ and about $1 \times 10^{20}$ cm$^{-3}$.

Following formation of the two layers, an optional crystallizing anneal can be performed at a temperature difference between about 25° C. and 125° C., or between about 50° C. and 100° C. above the higher layers' deposition temperature. The crystallizing anneal can be performed for a time period less than or equal to about 5 minutes, or less than or equal to about 3 minutes, or less than or equal to about 1 minute. During the anneal, all deposition sources may be closed. Following the anneal, a return to the deposition temperature and continuation of the deposition may commence.

After forming the buffer and high doped layers, a CdTe/Cd$_x$Zn$_{1-x}$Te light-absorbing layer (also "absorber layer" herein) may be grown as a p-type and n-type heterojunction (or homojunction in case x is equal to 1). P-type doping can be achieved with the aid of arsenic; n-type doping can be achieved with the aid of indium. The p-type CdTe light absorbing layer can have a thickness of between about 1.0 microns and about 3.0 microns. The p-type CdTe light absorbing layer can be formed at a deposition temperature between about 200° C. and about 350° C., or between about 250° C. and about 300° C. In a preferable embodiment, the CdTe layer is doped in situ with arsenic to produce a p-type material layer having an arsenic activated doping concentration between about $1 \times 10^{17}$ cm$^{-3}$ and $4 \times 10^{17}$ cm$^{-3}$. In an alternative embodiment, the first 200-500 Å of arsenic doping concentration is between about $1 \times 10^{18}$ to $3 \times 10^{18}$ cm$^{-3}$ and then ramped down to the range $1 \times 10^{17}$ to $4 \times 10^{17}$ cm$^{-3}$. The n-type Cd$_x$Zn$_{1-x}$Te layer can have a thickness between about 0.25 microns and about 1 microns. The n-type Cd$_x$Zn$_{1-x}$Te light absorbing layer can be formed at a deposition temperature between about 200° C. and about 350° C., or between about 250° C. and about 300° C. In a preferable embodiment, the Cd$_x$Zn$_{1-x}$Te layer is doped in situ with indium to produce an n-type material layer having an indium activated doping concentration between about $1 \times 10^{18}$ cm$^{-3}$ and $4 \times 10^{18}$ cm$^{-3}$. In an embodiment, the n-type Cd$_x$Zn$_{1-x}$Te layer is formed immediately following formation of the p-type CdTe layer and at the same superstrate temperature as the CdTe deposition. For instance, while forming the p-type CdTe layer by exposing the solar cell structure to a Cd source, a Te source and an As source, the As source can be closed off and an In source and a Zn source can be immediately introduced.

Following formation of the CdTe p-type light-absorbing layer, an optional crystallizing and grain boundary passivating anneal can be performed at a temperature difference between about 25° C. and 125° C., or between about 50° C. and 100° C. above the CdTe deposition temperature. The crystallizing and grain boundary passivating anneal can be performed for a time period less than or equal to about 10 minutes, or less than or equal to about 5 minutes, or less than or equal to about 3 minutes. In an embodiment, the crystallizing and grain boundary passivating anneal is performed under a Cd and As overpressure. All other sources of material flux are closed off during this anneal. In another embodiment, the crystallizing and grain boundary passivating anneal is performed under a Cd and Zn overpressure with an optional As overpressure. All other sources of material flux are closed off during this anneal. In an embodiment, the crystallizing and grain boundary passivating anneal is performed more than once and at predetermined intervals during formation of the CdTe light-absorbing layer. In such a case, the crystallizing and grain boundary passivating anneal can be performed at CdTe light-absorbing layer thickness steps between about 0.2 microns and about 0.8 micron, or between about 0.4 microns and about 0.6 microns, for a time period less than or equal to about 3 minutes, or less than or equal to about 2 minutes, or less than or equal to about 1 minute per anneal, and followed by a return to the deposition temperature and continuation of the deposition of the CdTe/Cd$_x$Zn$_{1-x}$Te light absorbing layer.

Following formation of the Cd$_x$Zn$_{1-x}$Te n-type light-absorbing layer, a thin, high doped n-type Cd$_x$Zn$_{1-x}$Te (n+ Cd$_x$Zn$_{1-x}$Te) layer can be grown between the n-type Cd$_x$Zn$_{1-x}$Te layer and the final metal contact to provide a low ohmic contact between the Cd$_x$Zn$_{1-x}$Te n-type light absorbing layer and the metal contact. N-type doping of the n+ Cd$_x$Zn$_{1-x}$Te layer can be achieved with the aid of indium. The n+ Cd$_x$Zn$_{1-x}$Te layer can have a thickness less than or equal to about 300 Å, or less than or equal to about 200 Å, or less than or equal to about 100 Å. The n+ Cd$_x$Zn$_{1-x}$Te layer can be formed at a deposition temperature between about 200° C. and about 350° C., or between about 250° C. and about 300° C. The concentration of n-type dopant (e.g., indium) in the n+ Cd$_x$Zn$_{1-x}$Te layer can be between about $1 \times 10^{19}$ and $1 \times 10^{20}$ cm$^{-3}$. In an embodiment, the deposition temperature of the n+ Cd$_x$Zn$_{1-x}$Te layer is the same as the deposition temperature of the Cd$_x$Zn$_{1-x}$Te n-type light-absorbing layer.

An optional metal contact layer can provide the final contact between the Cd$_x$Zn$_{1-x}$Te layers (light absorbing layer and high n-type doped layer) and the metallization of the backside of the structure. The final metal contact layer is formed by exposure of the cell to Sb and Te sources of flux or Hg and Te sources of flux, with all other sources of material flux closed off. The formation of this SbTe (HgTe) layer can have a thickness less than or equal to about 300 Å, or less than or equal to about 200 Å, or less than or equal to about 100 Å. The SbTe layer can be deposited at a deposition temperature between about 200° C. and about 350° C., or between about 250° C. and about 300° C. In a preferable embodiment, the deposition temperature of the SbTe layer is the same as the deposition temperature of the Cd$_x$Zn$_{1-x}$Te layers. The HgTe layer can be deposited at a deposition temperature between about 150° C. and about 250° C.

The final metal contact and laser cell scribing can be formed in situ in auxiliary chambers (or secondary chambers). The auxiliary chambers are in-line with the primary MBE vacuum chamber. The primary MBE vacuum chamber may be the primary semiconductor deposition chamber. The metal contact and concomitant cell scribing may be formed in situ by transferring the photovoltaic device of FIG. 1 from the primary MBE vacuum chamber to the auxiliary in-line chambers under vacuum. The metal contact layer can have a thickness between about 10,000 Å and 20,000 Å.

The structure of FIG. 1 includes a p-n junction capable of absorbing light (such as solar light) at wavelengths from near ultraviolet ("UV") to about 850 nm, and creating electricity by the flow of charge generated when the p-n junction is exposed to light. Embodiments provide in situ methods for forming low ohmic metal contacts to the front and backside of the p-n junction solar cell, high doping of the absorber layers, passivation of the grain boundaries, compositionally-graded heterostructures, and high accuracy control of layer thicknesses and junction location, in order to optimize the extraction of photo-generated current and open circuit voltage when the absorber layer of the p-n junction solar cell is exposed to light.

The reverse p-n junction structure of FIG. 1, or as otherwise described, can be formed in a vacuum chamber configured for molecular beam epitaxy ("MBE"). The MBE chamber may be attached to one or more other vacuum chambers for forming one or more layers of the p-n junction structure. For instance, the MBE chamber may be attached to a vacuum chamber configured for forming the metal contact via sputtering or e-beam evaporation and a vacuum chamber configured for performing the laser cell scribing. Alternatively, multiple in-line vacuum chambers can be arranged to provide particular layer depositions of the overall device structure, with potential increase in overall through-put.

Formation of one or more layers of the reverse p-n junction structure may be achieved via any MBE technique known in the art or similar high vacuum techniques that provide a free-streaming flux of elements or reactive molecules. In an embodiment, one or more layers of reverse p-n junction structures of embodiments are formed by heritage MBE, which provides high throughput, polycrystalline deposition while retaining the control advantages of conventional MBE. The flux of elements may be adjusted to provide a deposition rate less than or equal to about 20 microns/hour, or less than or equal to about 10 microns/hours, less than or equal to about 1 microns/hour, depending on the layer being deposited. In a preferable embodiment, the flux of elements may be adjusted to provide a deposition rate between about 6 and 10 microns/hour for the bulk p-n junction and back contact layer growths and a deposition rate less than or equal to about 1 micron/hour for the initial thin buffer layer and high doped p-type starting layers. MBE is used to produce a polycrystalline material structure with a total thickness between about 1.25 micrometers ("microns") and about 4 microns on an optically transparent superstrate, e.g., a transparent conductive oxide-coated glass superstrate, at a deposition temperature between about 200° C. and about 350° C., or between about 250° C. and about 300° C., on a superstrate area greater than or equal to about 0.36 m$^2$ (i.e., a superstrate having a length and/or a width greater than or equal to about 600 mm). In an embodiment, the layers are grown at the same temperature or within 25° C. of each other. In an embodiment, the total structure has a thickness of about 1.25 microns. In a preferred embodiment, the superstrate area is greater than or equal to about 1 m$^2$.

n-p and n$^+$-Intrinsic-p$^+$ Junction Solar Cell Structures

In another aspect of the invention, an n-p junction solar cell (or photovoltaic) device is grown by MBE on a superstrate with or without a transparent conductive oxide (TCO). In a preferable embodiment, the highly doped front layer of the device structure serves as the front side low ohmic contact and a TCO coating is unnecessary since deposition can occur directly onto the bare glass superstrate. The semiconductor layers grown in sequence over a superstrate include: an optional thin buffer layer; a thin, high doped n-type, low ohmic contact layer; an n-p junction; a thin, high doped p-type, low ohmic contact layer; an optional very low ohmic "semimetal" contact, e.g., SbTe, as the final semiconductor layer. A metal contact is provided at the backside of the complete structure. The metal contact, along with the concomitant laser cell scribing, may be formed via in situ metallization and scribing.

In some embodiments, the solar cell structure may have at least three layers of different semiconductor materials. In some embodiments, the semiconductor materials may comprise material selected from the group consisting of ZnTe, MgTe, x-graded $Cd_xZn_{1-x}Te$, and CdTe. The n-p junction solar cell structure may optionally include an SbTe ($Sb_2Te_3$) or HgTe layer for providing contact to a metal contact at the backside of the p-n junction solar cell structure (also "the structure" herein).

With reference to FIG. 3, an n-p junction photovoltaic ("PV") cell (also "solar cell" herein) structure comprises an n-type (i.e., doped n-type) CdTe layer over a superstrate and a p-type (i.e., doped p-type) $Cd_xZn_{1-x}Te$ layer over the n-type CdTe layer, in accordance with an embodiment of the invention. The n-type CdTe layer and the p-type $Cd_xZn_{1-x}Te$ layer define an n-p heterojunction (or structure). This heterojunction advantageously precludes the need for the CdS n-type layer of prior thin film devices. In an embodiment, with 'x' equal to 1, the n-p layer is formed of polycrystalline CdTe homojunction. In another embodiment, 'x' is greater than 0 and less than 1, and the n-p layer is formed of a $CdTe/Cd_xZn_{1-x}Te$ heterojunction. In an embodiment, 'x' is equal to about 0.60. In another embodiment, 'x' is equal to about 0.75.

With continued reference to FIG. 3, the n-type CdTe layer and the p-type $Cd_xZn_{1-x}Te$ layer define the light-absorbing layers of the PV cell. The n-p junction PV cell can include an optional, thin intrinsic (i.e., undoped or very low doped) resistive ZnTe or MgTe layer (also "buffer layer" herein) between the superstrate and the n-type CdTe layer. A thin, high doped n-type CdTe layer (i.e., n+ CdTe) may be provided between the optional resistive buffer layer and the n-type CdTe layer.

The n-p junction PV cell can further include a metal contacting layer over the p-type $Cd_xZn_{1-x}Te$ layer. To improve electrical contact between the metal contact and the p-type $Cd_xZn_{1-x}Te$ layer, a thin, high doped p-type $Cd_xZn_{1-x}Te$ (i.e., p+ $Cd_xZn_{1-x}Te$) layer may be provided between the p-type $Cd_xZn_{1-x}Te$ layer and the metal contact. To improve electrical contact between the metal contact and the p-type $Cd_xZn_{1-x}Te$ layer even further, a thin SbTe or HgTe layer may be provided between either the thin, high doped p-type $Cd_xZn_{1-x}Te$ layer (p+ $Cd_xZn_{1-x}Te$) and the metal contact, or, alternatively, between the p-type $Cd_xZn_{1-x}Te$ layer and the metal contact.

The n-p junction solar cell may further include an antireflective ("AR") coating layer at the superstrate frontside (light entering side) and/or between the superstrate and the transparent conductive oxide (TCO), if present, or the first structure layer, if absent. The AR layer can aid in minimizing reflection of light incident on the n-p junction solar cell. The n-p junction solar cell can further include an antireflective ("AR") coating layer (or layers on each side of the superstrate) that is designed to advantageously reflect/absorb particular colors of the solar spectrum to create an esthetically appealing custom color to the visible surface of the solar panel (for solar panel art or architectural appeal).

In an alternative embodiment (see FIG. 4), an intrinsic or substantially low doped CdTe (i.e., i-CdTe) layer is provided on the high doped n+ CdTe layer and the high doped p+ $Cd_xZn_{1-x}Te$ layer is formed over the i-CdTe layer. In such a case, the i-CdTe partially defines the n-intrinsic-p CdTe structure of an n-intrinsic-p junction solar cell device. The i-CdTe layer can be formed of polycrystalline CdTe. In a preferred embodiment, the i-CdTe layer has a thickness between about 1.0 micron and 1.5 microns. The i-CdTe layer can be deposited at a deposition temperature between about 200° C. and about 400° C., or between about 250° C. and about 350° C. Following formation of the i-CdTe (light-absorbing) layer, an optional crystallizing and grain boundary passivating anneal can be performed at a temperature difference between about 25° C. and 125° C., or between about 50° C. and 100° C. above the i-CdTe deposition temperature. The crystallizing and grain boundary passivating anneal can be performed for a time period less than or equal to about 10 minutes, or less than or equal to about 5 minutes, or less than or equal to about 3 minutes. In a preferable embodiment, the crystallizing and grain boundary passivating anneal is performed under a Cd overpressure. All other sources of material flux are closed off during this anneal. In another embodiment, the crystallizing and grain boundary passivating anneal is performed under a Cd and Zn overpressure. All other sources of material flux are closed off during this anneal. In an embodiment, the crystallizing and grain boundary passivating anneal is performed more than once and at predetermined intervals during formation of the i-CdTe light-absorbing layer. In such a case, the crystallizing and grain boundary passivating anneal can be performed at i-CdTe light-absorbing layer thickness steps between about 0.2 microns and about 0.8 micron, or between about 0.4 microns and about 0.6 microns, for a time period less than or equal to about 3 minutes, or less than or equal to about 2 minutes, or less than or equal to about 1 minute, per anneal, and followed by a return to the deposition temperature and continuation of the deposition of the i-CdTe light absorbing layer.

Some of the layers discussed herein in relation to various embodiments or aspects of the invention may be optional. In some embodiments, the layers may be provided in the sequence described, while in other embodiments, some variation in sequence may be provided (e.g., switching the sequence of the CdTe and CdZnTe layers for the p-n heterojunction). Any neighboring layers that differ in compositional structure by addition (and/or removal) of another element (e.g., a CdTe layer adjacent a ZnTe layer, or a CdTe layer adjacent a $Cd_xZn_{1-x}Te$ layer) may be graded between the two compositions by varying the mole fraction 'x' to ameliorate band-gap barriers that arise from directly depositing two different band-gap materials next to each other. This grading will occur over a thickness between about 0.1 microns and 0.5 microns.

With reference to FIG. 3, in a preferable embodiment, an n-p junction solar cell structure comprises an optional, highly resistive, thin film ZnTe or MgTe buffer layer on a superstrate, and a thin, highly n-doped CdTe layer (i.e., n+ CdTe) over the thin resistive buffer layer. The superstrate can be formed of a semiconductor material or an amorphous material such as, e.g., standard soda lime glass. The superstrate may require an optional transparent conductive oxide (TCO) to provide the electrical front contact. Alternatively a thin metal foil substrate can be used with the cell structure embodiments grown in reverse order so the incoming light continues to enter the same layer sequence as with a superstrate. The final deposition layer in this sequence must be a transparent conductive oxide deposited in an in-line chamber next to the primary deposition chamber or the high doped contact layer of the device structure itself. The buffer layer can have a thickness less than or equal to about 300 Å, or less than or equal to about 200 Å, or less than or equal to about 100 Å. The buffer layer can be deposited over the superstrate at a deposition temperature between about 200° C. and about 400° C., or between about 250° C. and about 350° C. In a preferable embodiment, the buffer layer is formed via molecular beam epitaxy ("MBE") at a growth rate about 1 Å per second. The n+ CdTe layer can have a thickness less than or equal to about 300 Å, or less than or equal to about 200 Å, or less than or equal to about 100 Å. The n+ CdTe layer can be deposited on the buffer layer at a deposition temperature between about 200° C. and about 400° C., or between about 250° C. and about 350° C. In a preferable embodiment, the CdTe layers is formed via molecular beam epitaxy ("MBE") at a CdTe growth rate about 1 Å per second and at the same deposition temperature as the buffer layer.

In a preferable embodiment, the high doped n+ CdTe layer is doped in situ with indium to produce an n+ material layer having an indium doping concentration between about $1 \times 10^{19}$ cm$^{-3}$ and about $1 \times 10^{20}$ cm$^{-3}$.

Following formation of the ZnTe (or MgTe) and n+ CdTe layers, an optional crystallizing anneal may be performed at a temperature difference between about 25° C. and 125° C., or between about 50° C. and 100° C. above the CdTe deposition temperature. The crystallizing anneal can be performed for a time period less than or equal to about 5 minutes, or less than or equal to about 3 minutes, or less than or equal to about 1 minute. During the anneal, all deposition sources should be closed except for the Cd source. Following the anneal, a return to the deposition temperature and continuation of the deposition shall commence.

After forming the ZnTe (or MgTe) and n+ CdTe layers, a CdTe/$Cd_xZn_{1-x}Te$ light-absorbing layer (also "absorber layer" herein) may be grown as an n-type and p-type heterojunction, or homojunction in case 'x' equals 1. N-type doping can be achieved with the aid of indium; p-type doping can be achieved with the aid of arsenic. The n-type CdTe light absorbing layer can have a thickness of between about 1 microns and about 3 microns. The n-type CdTe light absorbing layer can be formed at a deposition temperature between about 200° C. and about 400° C., or between about 250° C. and about 350° C. In a preferable embodiment, the CdTe layer is doped in situ with indium to produce an n-type material layer having an indium activated doping concentration between about $1 \times 10^{17}$ cm$^{-3}$ and about $4 \times 10^{17}$ cm$^{-3}$. The p-type $Cd_xZn_{1-x}Te$ layer can have a thickness between about 0.25 microns and about 1 micron. The p-type $Cd_xZn_{1-x}Te$ light absorbing layer can be formed at a deposition temperature between about 200° C. and about 400° C., or between about 250° C. and about 350° C. In a preferable embodiment, the $Cd_xZn_{1-x}Te$ layer is doped in situ (i.e., in the MBE chamber) with arsenic to produce a p-type material layer having an arsenic activated doping concentration between about $5 \times 10^{17}$ cm$^{-3}$ and about $1 \times 10^{18}$ cm$^{-3}$. In a preferable embodiment, the p-type $Cd_xZn_{1-x}Te$ layer is formed immediately following formation of the n-type CdTe layer and at the same superstrate temperature as the CdTe deposition. For instance, while forming the n-type CdTe layer by exposing the solar cell structure to a Cd source, a Te source and an In source, the In source can be closed off (or terminated) and an As source and a Zn source can be immediately introduced.

Following formation of the CdTe n-type light-absorbing layer, an optional crystallizing and grain boundary passivating anneal can be performed at a temperature difference between about 25° C. and 125° C., or between about 50° C. and 100° C. above the CdTe deposition temperature. The crystallizing and grain boundary passivating anneal can be performed for a time period less than or equal to about 10 minutes, or less than or equal to about 5 minutes, or less than or equal to about 3 minutes. In a preferable embodiment, the crystallizing and grain boundary passivating anneal is performed under a Cd overpressure and optional In overpressure. All other sources of material flux are closed off during this anneal. In an embodiment, the crystallizing and grain boundary passivating anneal is performed more than once and at predetermined intervals during formation of the CdTe light-absorbing layer. In such a case, the crystallizing and grain boundary passivating anneal can be performed at CdTe light-absorbing layer thickness steps between about 0.2 microns and about 0.8 micron, or between about 0.4 microns and about 0.6 microns, for a time period less than or equal to about 3 minutes, or less than or equal to about 2 minutes, or less than or equal to about 1 minute, per anneal, and followed by a return to the deposition temperature and continuation of the deposition of the CdTe/$Cd_xZn_{1-x}Te$ light absorbing layer.

Following formation of the $Cd_xZn_{1-x}Te$ p-type light-absorbing layer, a thin, high doped p-type $Cd_xZn_{1-x}Te$ (p+ $Cd_xZn_{1-x}Te$) layer can be grown between the p-type $Cd_xZn_{1-x}Te$ layer and the final metal contact to provide low ohmic contact between the $Cd_xZn_{1-x}Te$ p-type light absorbing layer and the metal contact. P-type doping of the p+ $Cd_xZn_{1-x}Te$ layer can be achieved with the aid of arsenic. The p+ $Cd_xZn_{1-x}Te$ layer can have a thickness less than or equal to about 300 Å, or less than or equal to about 200 Å, or less than or equal to about 100 Å. The p+ $Cd_xZn_{1-x}Te$ layer can be formed at a deposition temperature between about 200° C. and about 400° C., or between about 250° C. and about 350° C. The concentration of p-type dopant (e.g., arsenic) in the p+ $Cd_xZn_{1-x}Te$ layer may be between about $1\times10^{18}$ and about $5\times10^{18}$ $cm^{-3}$. In an alternative embodiment x=0 (ZnTe) and the dopant is nitrogen at a concentration between about $1\times10^{19}$ and $1\times10^{20}$ $cm^{-3}$ to produce a p+ type, ohmic material for metal contact. In a preferable embodiment, the (superstrate) deposition temperature of the p+ $Cd_xZn_{1-x}Te$ layer is the same as the deposition temperature of the CdTe n-type light-absorbing layer.

An optional metal contact layer can provide the final contact between the $Cd_xZn_{1-x}Te$ layers (light absorbing layer and high p-type doped layer) and the metallization of the backside of the structure. The final metal contact layer may be formed by exposure of the PV cell to Sb and Te sources of flux or Hg and Te sources of flux, with all other sources of material flux closed off. The SbTe or HgTe layer formed can have a thickness less than or equal to about 300 Å, or less than or equal to about 200 Å, or less than or equal to about 100 Å. The SbTe layer can be deposited at a deposition temperature between about 200° C. and about 400° C., or between about 250° C. and about 350° C. In an embodiment, the deposition temperature of the SbTe layer is the same as the deposition temperature of the $Cd_xZn_{1-x}Te$ layers. The HgTe layer can be deposited at a deposition temperature between about 150° C. and about 250° C.

The final metal contact and laser cell scribing can be formed in situ in auxiliary chambers (or secondary chambers). The auxiliary chambers may be in-line with the primary MBE vacuum chamber. The primary MBE vacuum chamber may be the primary semiconductor deposition chamber. The metal contact and concomitant cell scribing may be formed in situ by transferring the photovoltaic device of FIG. 3 from the primary MBE vacuum chamber to the auxiliary in-line chambers under vacuum. The metal contact layer may have a thickness between about 10,000 Å and 20,000 Å.

The structure of FIG. 3 includes an n-p junction capable of absorbing solar light at wavelengths from near ultraviolet ("UV") to about 850 nm, and creating electricity by the flow of charge generated when the n-p junction is exposed to light. Embodiments of the invention provide in situ methods for forming low ohmic metal contacts to the front and backsides of the n-p junction solar cell, high doping of the absorber layers, passivation of the grain boundaries, compositionally-graded heterostructures, and high accuracy control of layer thicknesses and junction location, in order to optimize the extraction of photo-generated current and open circuit voltage when the absorber layer of the n-p junction solar cell is exposed to light.

The n-p and n-intrinsic-p junction structures of FIGS. 3 and 4 may be formed in a vacuum chamber configured for molecular beam epitaxy ("MBE"). The MBE chamber may be attached to one or more other vacuum chambers for forming one or more layers of the n-p junction structure. For instance, the MBE chamber may be attached to a vacuum chamber configured for forming the metal contact via sputtering or e-beam evaporation and a vacuum chamber configured for performing laser cell scribing. In an alternative embodiment, multiple in-line vacuum chambers can be arranged to provide particular layer depositions of the overall device structure, with increases in overall through-put.

Formation of one or more layers of the n-p junction structure and the n-intrinsic-p junction structure may be achieved via any MBE technique or similar high vacuum techniques that provide a free-streaming flux of elements or reactive molecules. The flux of elements may be adjusted to provide a deposition rate less than or equal to about 20 microns/hour, or less than or equal to about 10 microns/hours, less than or equal to about 1 micron/hour, depending on the layer being deposited. In a preferable embodiment, the flux of elements may be adjusted to provide a deposition rate between about 6 microns/hour and about 10 microns/hour for the bulk n-p junction and back contact layer growths and a deposition rate less than or equal to about 1 micron/hour for the initial thin buffer and high doped n-type starting layers. MBE may be used to produce a polycrystalline material structure with a total thickness between about 1.25 micrometers ("microns") and about 4 microns on an optically transparent superstrate, e.g., a transparent conductive oxide-coated glass superstrate, at a deposition temperature between about 200° C. and about 400° C., or between about 250° C. and about 350° C., on a superstrate area greater than or equal to about 0.36 $m^2$ (i.e., a superstrate having a length and/or a width greater than or equal to about 600 mm). In an embodiment, the layers are grown at the same temperature. In another embodiment, the layers are grown at temperatures within about 25° C. of each other. In an embodiment, the total structure thickness is about 1.25 microns. In an embodiment, the superstrate area is greater than or equal to about 1 $m^2$.

Tandem Solar Cell Structure

In another aspect of the invention, a double "reverse" p-n junction (also "tandem junction" and "dual junction" herein) solar cell device (also "photovoltaic device" herein) is provided having at least three layers of semiconductor materials, including ZnTe, MgTe, $Cd_xZn_{(1-x)}Te$ and CdTe. The tandem junction solar cell structure may optionally include an SbTe or HgTe layer for providing contact to a metal contact at the backside of the dual p-n junction solar cell structure (also "the structure" herein). In a preferable embodiment, the structure is deposited via MBE on a superstrate with or without a transparent conductive oxide (TCO) layer. In a preferable embodiment, the highly doped front layer of the device structure serves as the front side low ohmic contact and a TCO coating is unnecessary since deposition can occur directly onto the bare glass superstrate. The successive semiconductor layers grown in sequence on a superstrate include: an optional thin buffer layer; a thin, high doped p-type, low ohmic contact layer; a higher energy band-gap p-n junction; an n-p tunneling junction (also "tunnel junction" herein); a lower energy band-gap p-n junction; a thin, high doped n-type, low ohmic layer; and an optional substantially low ohmic semimetal contact, e.g., HgTe or SbTe, as the final semiconductor layer. A metal contact is provided at the backside of the complete structure. The metal contact, along with the concomitant laser cell scribing, may be formed via in situ metallization and scribing. The tandem junction solar cell device of preferable embodiments may be configured to absorb light in the wavelength range of near ultraviolet ("UV") to near infrared ("IR") to generate electricity.

With reference to FIG. 5, in an embodiment, the tandem junction solar cell device may comprise an optional, highly resistive, substantially thin ZnTe or MgTe buffer layer grown on an optional transparent conductive oxide (TCO) formed over a superstrate, such as, e.g., a standard soda lime glass substrate. This is followed by forming a substantially thin, high doped p-type ZnTe (p+ ZnTe) layer for providing ohmic contact to the superstrate. A primary light absorbing structure comprising a CdZnTe light absorbing structure and a CdTe light absorbing structure is grown over the p+ ZnTe layer. In a preferable embodiment, the CdZnTe light absorbing structure comprises a p-type CdZnTe layer and an n-type CdZnTe layer (i.e., it is a p-n CdZnTe layer); the CdTe light absorbing structure comprises a p-type CdTe layer and an n-type CdTe layer (i.e., it is a p-n CdTe layer). The CdZnTe structure has a high energy band gap that absorbs ultraviolet to visible light; longer wavelength visible light and near infrared light are passed to the CdTe structure, which has a low energy band gap (lower energy band gap than the CdZnTe structure). To provide an electrical connection between the two p-n junctions a tunneling n-p junction is provided with a substantially thin, high doped n-type CdZnTe (n+ CdZnTe) layer formed over the first (higher energy band gap) light-absorbing p-n CdZnTe layer followed by a substantially thin, high doped p-type CdTe (p+ CdTe) layer followed by deposition of the second (lower energy band gap) light-absorbing p-n CdTe layer. A thin, high doped n-type CdTe (n+ CdTe) layer is deposited over the final p-n CdTe light absorbing layer to provide final ohmic contact to a metal contact at the backside of the tandem junction solar cell device.

Next, an optional SbTe or HgTe layer may be provided on the n+ CdTe layer to enhance the ohmic contact to the metal contact. The SbTe or HgTe layer may be formed by deposition of elemental Sb and Te or elemental Hg and Te. The tandem junction solar cell can further include an antireflective ("AR") coating layer at the superstrate frontside (light entering side) and/or between the superstrate and the transparent conductive oxide, if present, or the first structure layer, if absent. The AR layer can aid in minimizing reflection of light incident on the tandem junction solar cell. The tandem junction solar cell can further include an antireflective ("AR") coating layer (or layers on each side of the superstrate) that is designed to advantageously reflect/absorb particular colors of the solar spectrum to create an esthetically appealing custom color to the visible surface of the solar panel (solar panel art or architectural appeal).

The final metal contact and laser cell scribing can be formed in situ in one or more auxiliary chambers (or secondary chambers). The one or more auxiliary chambers may be in-line with the primary MBE vacuum chamber. The primary MBE vacuum chamber may be the primary semiconductor deposition chamber. The metal contact and concomitant cell scribing may be formed in situ by transferring the photovoltaic device of FIG. 5 from the primary MBE vacuum chamber to the one or more auxiliary in-line chambers under vacuum. The metal contact layer can have a thickness between about 10,000 Å and 20,000 Å.

In embodiments, the tandem junction solar cell device comprises a thin ZnTe or MgTe buffer layer over the superstrate (with or without the TCO). The tandem junction solar cell may also comprise a thin, high doped p-type ZnTe (p+ ZnTe) layer over the buffer layer. The highly resistive buffer layer can have a thickness less than or equal to about 300 Å, or less than or equal to about 200 Å, or less than or equal to about 100 Å. The high doped p-type ZnTe layer can have a thickness less than or equal to about 300 Å, or less than or equal to about 200 Å, or less than or equal to about 100 Å. The two layers can each be deposited over the superstrate at a deposition temperature between about 200° C. and about 400° C., or between about 250° C. and about 350° C. In a preferable embodiment, the two layers are formed via molecular beam epitaxy ("MBE") at a growth rate of about 1 Å per second.

In a preferable embodiment, the high doped ZnTe layer is doped in situ with nitrogen to produce a p+ material layer having a nitrogen doping concentration between about $1 \times 10^{19}$ cm$^{-3}$ and about $1 \times 10^{20}$ cm$^{-3}$.

Following formation of the buffer and high doped layers, an optional crystallizing anneal may be performed at a temperature difference between about 25° C. and 125° C., or between about 50° C. and 100° C. above the higher layers' (superstrate) deposition temperature. The crystallizing anneal can be performed for a time period less than or equal to about 5 minutes, or less than or equal to about 3 minutes, or less than or equal to about 1 minute. During the anneal, all deposition sources are closed. Following the anneal, the superstrate is returned to the deposition temperature and the deposition is continued.

After forming the buffer and high doped layers, a $Cd_xZn_{1-x}Te$ light-absorbing layer (also "absorber layer" herein) may be grown as a p-type and n-type homojunction. P-type doping can be achieved with the aid of arsenic; n-type doping can be achieved with the aid of indium. The p-type $Cd_xZn_{1-x}Te$ light absorbing layer can have a thickness of between about 0.25 microns and about 0.75 microns. The p-type $Cd_xZn_{1-x}Te$ light absorbing layer can be formed at a deposition temperature between about 200° C. and about 400° C., or between about 250° C. and about 350° C. In a preferable embodiment, the $Cd_xZn_{1-x}Te$ layer is doped in situ with arsenic to produce a p-type material layer having an arsenic activated doping concentration between about $1 \times 10^{17}$ cm$^{-3}$ and about $4 \times 10^{17}$ cm$^{-3}$. The n-type $Cd_xZn_{1-x}Te$ layer can have a thickness between about 0.25 microns and about 0.5 microns. The n-type $Cd_xZn_{1-x}Te$ light absorbing layer can be formed at a deposition temperature between about 200° C. and about 400° C., or between about 250° C. and about 350° C.

In a preferable embodiment, the $Cd_xZn_{1-x}Te$ layer is doped in situ with indium to produce an n-type material layer having an indium activated doping concentration between about $1 \times 10^{18}$ cm$^{-3}$ and about $4 \times 10^{18}$ cm$^{-3}$. In a preferable embodiment, the n-type $Cd_xZn_{1-x}Te$ layer is formed immediately following formation of the p-type $Cd_xZn_{1-x}Te$ layer. For instance, while forming the p-type $Cd_xZn_{1-x}Te$ layer by exposing the solar cell structure to a Cd source, a Te source, a Zn source, and an As source, the As source can be shut off (or turned off) and an In source can be immediately introduced.

Following formation of the p-type CdZnTe light-absorbing layer (p-n CdZnTe homojunction), an optional crystallizing and grain boundary passivating anneal can be performed at a temperature difference between about 25° C. and 125° C., or between about 50° C. and 100° C. above the CdZnTe deposition temperature. The crystallizing and grain boundary passivating anneal can be performed for a time period less than or equal to about 10 minutes, or less than or equal to about 5 minutes, or less than or equal to about 3 minutes. In a preferable embodiment, the crystallizing and grain boundary passivating anneal is performed under a Cd and As overpressure. All other sources of material flux are shut off (or closed off) during this anneal. In another embodiment, the crystallizing and grain boundary passivating anneal is performed under a Cd and Zn overpressure with an optional As overpressure. All other sources of material flux are closed off during this anneal. In an embodiment, the crystallizing and grain boundary passivating anneal is performed more than once and at predetermined intervals during formation of the CdZnTe light-absorbing layer. In such a case, the crystallizing and grain boundary passivating anneal can be performed at CdZnTe light-absorbing layer thickness steps between about 0.2 microns and about 0.8 micron or between about 0.4 microns and about 0.6 microns, for a time period less than or equal to about 3 minutes, or less than or equal to about 2 minutes, or less than or equal to about 1 minute per anneal, and followed by a return to the deposition temperature and continuation of the deposition of the $Cd_xZn_{1-x}Te$ light absorbing layer. In an embodiment, the crystallizing and grain boundary passivating anneal is performed during formation of the p-type CdZnTe layer but not during formation of the n-type CdZnTe layer. In yet another embodiment, the crystallizing and grain boundary passivating anneal is performed during formation of both the p-type and n-type CdZnTe layers with As overpressure replaced with In overpressure for the n-type CdZnTe layer anneal.

In a preferred embodiment, the Cd:Ze ratio is adjusted to provide a cut-off wavelength between 610 nm and 650 nm (2.0 eV band-gap energy and 1.9 eV band-gap energy, respectively) for the $Cd_xZn_{1-x}Te$ p-n homojunction.

Next, a high doped n-type CdZnTe (n+ CdZnTe) layer may be formed over the p-n CdZnTe layer. In the illustrated embodiment of FIG. 5, the high doped CdZnTe layer is doped in situ with indium to produce an n+ material layer.

Next, a high doped p-type CdTe (p+ CdTe) layer is provided over the n+ CdZnTe layer and below the p-n CdTe layer. In the illustrated embodiment of FIG. 5, the high doped CdTe layer is doped in situ with arsenic to produce a p+ material layer. The n+ CdZnTe layer and the p+ CdTe layer define a tunneling heterojunction for providing electrical contact between the p-n CdZnTe layer and the p-n CdTe layer.

The n+ CdZnTe of the tunneling junction can have the same Cd, Zn and Te composition (and be formed at the same deposition temperature) as the n-type CdZnTe layer of the p-n CdZnTe layer below. The n+ CdZnTe layer can have a thickness less than or equal to about 100 Å; it can be doped n-type with the aid of Indium at a concentration greater than or equal to about $5\times10^{19}$ cm$^{-3}$. The p+ CdTe layer of the tunneling junction can have a thickness less than or equal to about 50 Å; it can be doped p-type with the aid of Arsenic at a concentration greater than or equal to about $3\times10^{18}$ cm$^{-3}$.

The CdTe light absorbing p-n junction can be formed at a deposition temperature between about 200° C. and about 400° C., or between about 250° C. and about 350° C. In a preferable embodiment, the p-type CdTe layer is doped in situ with arsenic to produce a p-type material layer having an arsenic activated doping concentration about $1\times10^{17}$ cm$^{-3}$ to $4\times10^{17}$ cm$^{-3}$. The p-type CdTe layer can have a thickness between about 0.75 microns and about 1.0 microns. In a preferable embodiment, the n-type CdTe layer is doped in situ with indium to produce an n-type material layer having an indium activated doping concentration about $1\times10^{18}$ cm$^{-3}$ to $4\times10^{18}$ cm$^{-3}$. The n-type CdTe layer can have a thickness between about 0.25 microns and about 0.50 microns. In a preferable embodiment, the n-type CdTe layer is formed immediately following formation of the p-type CdTe layer. For instance, while forming the p-type CdTe layer by exposing the solar cell structure to a Cd source, a Te source and an As source, the As source can be closed off and an In source can be immediately introduced.

Following formation of the p-type CdTe light-absorbing layer, an optional crystallizing and grain boundary passivating anneal can be performed at a temperature difference between about 25° C. and 125° C., or between about 50° C. and 100° C. above the p-type CdTe deposition temperature. The crystallizing and grain boundary passivating anneal can be performed for a time period less than or equal to about 7 minutes, or less than or equal to about 5 minutes, or less than or equal to about 3 minutes. In a preferable embodiment, the crystallizing and grain boundary passivating anneal is performed under a Cd and As overpressure. All other sources of material flux are closed off during this anneal. In an embodiment, the crystallizing and grain boundary passivating anneal is performed more than once and at predetermined intervals during formation of the p-type CdTe light-absorbing layer. In such a case, the crystallizing and grain boundary passivating anneal can be performed at CdTe light-absorbing layer thickness steps between about 0.2 microns and about 0.8 micron or between about 0.4 microns and about 0.6 microns, for a time period less than or equal to about 3 minutes, or less than or equal to about 2 minutes, or less than or equal to about 1 minute, per anneal, and followed by a return to the deposition temperature and continuation of the deposition of the CdTe light absorbing layer. In a preferred embodiment, the n-type CdTe light-absorbing layer does not require an anneal.

Next, a high doped n-type CdTe (n+ CdTe) layer may be formed on the p-n CdTe layer. In the illustrated embodiment of FIG. 5, the n+ CdTe layer is a CdTe:In$^{++}$ layer. The n+ CdTe layer can have a thickness less than or equal to about 300 Å, or less than or equal to about 200 Å, or less than or equal to about 100 Å. It can be formed at a temperature between about 200° C. and about 400° C., or between about 250° C. and about 350° C. In an embodiment, the n+ CdTe layer has an Indium concentration between about $1\times10^{19}$ cm$^{-3}$ and $1\times10^{20}$ cm$^{-3}$. The n+ CdTe layer can provide ohmic contact between the p-n CdTe layer and an overlying metal contact.

An optional metal contact layer can provide the final contact between the CdTe layers (light absorbing CdTe layers and the n+ CdTe layer) and the metallization of the backside of the structure. The final metal contact layer may be formed by exposure of the PV cell to Sb and Te sources of flux or Hg and Te sources of flux, with all other sources of material flux closed off. In an embodiment, the SbTe or HgTe layer can have a thickness less than or equal to about 300 Å, or less than or equal to about 200 Å, or less than or equal to about 100 Å. The SbTe layer can be deposited at a deposition temperature between about 200° C. and about 400° C., or between about 250° C. and about 350° C. In a preferable embodiment, the deposition temperature of the SbTe layer is the same as the deposition temperature of the CdTe layers. The HgTe layer can be deposited at a deposition temperature between about 150° C. and about 250° C.

The final metal contact and laser cell scribing can be formed in situ in one or more auxiliary chambers (or secondary chambers). The auxiliary chambers may be in-line with the primary MBE vacuum chamber. The primary MBE vacuum chamber may be the primary semiconductor deposition chamber. The metal contact and concomitant cell scribing may be formed in situ by transferring the photovoltaic device of FIG. 5 from the primary MBE vacuum chamber to the auxiliary in-line chambers under vacuum. The metal contact layer can have a thickness between about 10,000 Å and 20,000 Å.

The structure of FIG. 5 includes dual p-n junctions capable of absorbing solar light at wavelengths from near ultraviolet ("UV") to about 850 nm, and creating electricity by the flow of charge generated when the p-n junctions are exposed to light. Various embodiments of the invention provide in situ methods for forming low ohmic metal contacts to the front and backside of the dual p-n junctions solar cell, high doping of the absorber layers, passivation of the grain boundaries, compositionally-graded hetero structures (as necessary), and high accuracy control of layer thicknesses and junction location, in order to optimize the extraction of photon-generated current and open circuit voltage when the absorber layer of the dual p-n junctions solar cell is exposed to light.

The dual ("tandem") p-n junctions structure of FIGS. 5 and 6 can be formed in a vacuum chamber configured for molecular beam epitaxy ("MBE"). The MBE chamber may be attached to one or more other vacuum chambers for forming one or more layers of the p-n junction structure. For instance, the MBE chamber may be attached to a vacuum chamber configured for forming the metal contact via sputtering or e-beam evaporation and a vacuum chamber configured for performing the laser cell scribing. In an alternative embodiment, multiple in-line vacuum chambers can be arranged to provide particular layer depositions of the overall device structure, with increases in overall through-put.

With reference to FIG. 6, in an alternative embodiment of the invention, the p and n doping configuration of the tandem junction solar cell device of FIG. 5 is reversed, providing n-p material layers. In the illustrated embodiment of FIG. 6, a tandem junction solar cell device comprises, from bottom to top, a superstrate, an optional TCO layer over the superstrate, and an optional ZnTe or MgTe buffer layer. A high doped n-type CdZnTe layer (n+ CdZnTe doped with In, or CdZnTe:In$^{++}$, as illustrated) is formed over the buffer layer or directly onto the TCO or bare glass substrate.

With continued reference to FIG. 6, the tandem junction solar cell device further comprises a CdZnTe homojunction (n-p CdZnTe layer) formed over the high doped n-type CdZnTe layer. The CdZnTe homojunction comprises an n-type CdZnTe layer and a p-type CdZnTe layer formed over the n+ CdZnTe layer. The tandem junction solar cell device further comprises a CdZnTe/CdTe tunneling heterojunction formed over the CdZnTe homojunction, the CdZnTe/CdTe tunneling heterojunction comprising a high doped p-type CdZnTe (p+ CdZnTe) layer and a high doped n-type CdTe (n+ CdTe) layer. The p+ CdZnTe layer can be doped with As (CdZnTe:As$^{++}$, as illustrated) and the n+ CdTe layer can be doped with In (CdTe:In$^{++}$, as illustrated).

The tandem junction solar cell device of FIG. 6 further comprises a CdTe homojunction (n-p CdTe layer) formed over the CdZnTe/CdTe tunneling heterojunction. The CdTe homojunction comprises an n-type CdTe layer formed over the n+ CdTe layer of the tunneling heterojunction. The CdTe homojunction further comprises a p-type CdTe layer formed over the n-type CdTe layer of the homojunction.

A high doped p-type CdTe (p+ CdTe) layer is provided over the p-type CdTe layer of the CdTe homojunction. In the illustrated embodiment of FIG. 6, the p+ CdTe layer is doped with As. An optional metal contact layer can provide the final contact between the CdTe layers (light absorbing CdTe homojunction and the p+ CdTe layer) and the metallization of the backside of the tandem junction solar cell structure. The final metal contact layer may comprise Sb and Te (i.e., SbTe or Sb$_2$Te$_3$) or Hg and Te (i.e., HgTe). The SbTe or HgTe layer may be formed via the methods discussed above in the context of FIG. 5. The SbTe or HgTe layer can have a thickness less than or equal to about 300 Å, or less than or equal to about 200 Å, or less than or equal to about 100 Å. In an embodiment, the SbTe layer is formed of Sb$_2$Te$_3$. A final metal contact can be provided over the p+ CdTe layer (and optional SbTe or HgTe layer). The metal contact can have a thickness between about 10,000 Å and 20,000 Å.

The thicknesses and compositions of one or more layers of the tandem junction solar cell structure of FIG. 6 may be similar to those discussed above in the context of the tandem junction solar cell structure of FIG. 5. As an example, the p-type CdZnTe layer of the CdZnTe homojunction of FIG. 6 may have the same thickness as the n-type CdZnTe layer of the CdZnTe homojunction of FIG. 5. In addition, one or more layers of the tandem junction solar cell structure of FIG. 6 may be formed via methods discussed above in the context of FIG. 5.

Formation of one or more layers of the dual p-n junction structures of FIGS. 5 and 6 may be achieved via any MBE technique known in the art or similar high vacuum techniques that provide a free-streaming flux of elements or reactive molecules. The flux of elements may be adjusted to provide a deposition rate less than or equal to about 20 microns/hour, or less than or equal to about 10 microns/hours, less than or equal to about 1 micron/hour, depending on the layer being deposited. In a preferable embodiment, the flux of elements may be adjusted to provide a deposition rate between about 6 microns/hour and 10 microns/hour for the bulk p-n junctions and back contact layer growths and a deposition rate less than or equal to about 1 micron/hour for the initial thin buffer layer and high doped p-type or n-type starting layer. MBE may be used to produce a polycrystalline material structure with a total thickness between about 1.5 micrometers ("microns") and about 4 microns on an optically transparent superstrate, e.g., a transparent conductive oxide-coated glass superstrate, at a deposition temperature between about 200° C. and about 400° C., or between about 250° C. and about 350° C., on a superstrate area greater than or equal to about 0.36 m$^2$ (i.e., a superstrate having a length and/or a width greater than or equal to about 600 mm). In an embodiment, the layers are grown at the same temperature or within 25° C. of each other. In an embodiment, the total structure thickness is about 1.5 microns. In an embodiment, the superstrate area is greater than or equal to about 1 m$^2$.

The metal contact layer(s) for any of the cell structures described herein can be formed of any elemental metal (e.g., Cu, Ni, Ti, Mo, Pt) with a relatively large work function, or a plurality of metal layers. In one embodiment, one or more of the metal contact layers discussed above may be formed by depositing Ti, Ni and Au layers in sequence, with each layer having a thickness between about 3000 and 6000 Angstroms.

Any of the structures and/or methods described herein may be combined. For example, a tandem solar cell structure may be provided with similar layers to n-p junction solar cells or reverse p-n junction solar cells. As another example, a tandem solar cell may be provided where n-type layers are deposited earlier (e.g., so they are closer to the superstrate layer) than the corresponding p-type layers. Similarly, any of the structures described herein may have additional optional layers. For example, tandem cells may be provided with additional layers of p-type and n-type paired layers, and/or tunneling layers. Or in some instances, tandem solar cells or reverse p-n junction solar cells may include an intrinsic layer, comparable to those described in various embodiments. In another example, a tandem solar cell may have any number of p-n layers, n-p layers, n-intrinsic-p layers, or p-intrinsic-n layers. As another example, a solar cell may have a p-n layer, n-p layer, n-intrinsic-p layer, or p-intrinsic-n layer. Any of the structures formed by the steps described herein, at any stage of the formation, may constitute an intermediate step or structure to a solar cell.

While in various embodiments reference has been made to a superstrate, any suitable substrate material may be used. In some embodiments, the various superstrate layers in FIGS. 1-6 can be substrate layers. In preferable embodiments, the substrate is configured to permit light to pass through and to the various layers of the PV device. In an alternative embodiment, the substrate is sufficiently opaque, and the PV device is configured to receive light from the opposite, non-substrate end of the PV device.

It should be understood from the foregoing that, while particular implementations have been illustrated and described, various modifications can be made thereto and are contemplated herein. It is also not intended that the invention be limited by the specific examples provided within the specification. While the invention has been described with reference to the aforementioned specification, the descriptions and illustrations of the preferable embodiments herein are not meant to be construed in a limiting sense. Furthermore, it shall be understood that all aspects of the invention are not limited to the specific depictions, configurations or relative proportions set forth herein which depend upon a variety of conditions and variables. Various modifications in form and detail of the embodiments of the invention will be apparent to a person skilled in the art. It is therefore contemplated that the invention shall also cover any such modifications, variations and equivalents.

What is claimed is:

1. A photovoltaic device, comprising:
   (a) a non-crystalline substrate or superstrate;
   (b) a first layer adjacent to said superstrate or substrate, the first layer comprising
      (i) tellurium (Te) and cadmium (Cd) or zinc (Zn), or
      (ii) Te, Cd and Zn;
   (c) a second layer adjacent to the first layer, the second layer comprising Cd and Te; and
   (d) a third layer adjacent to the second layer, the third layer comprising Cd and Te, wherein:
      (i) the first layer is chemically doped n-type, the second layer is chemically doped p-type, and the third layer is chemically doped p-type; or
      (ii) the first layer is chemically doped p-type, the second layer is chemically doped p-type, and the third layer is chemically doped n-type.

2. The photovoltaic device of claim 1, further comprising a layer comprising Zn and Te between said substrate or superstrate and said first layer.

3. The photovoltaic device of claim 1, further comprising a fourth layer adjacent to the third layer, the fourth layer comprising Cd and Te.

4. The photovoltaic device of claim 1, wherein one or more of said first layer, second layer and third layer comprise Te, Cd and Zn.

5. The photovoltaic device of claim 1, wherein
   (a) said first layer and second layer comprise Te, Cd and Zn;
   (b) said first layer and third layer comprise Te, Cd and Zn;
   (c) said second layer and third layer comprise Te, Cd and Zn; or
   (d) said first layer, second layer and third layer comprise Te, Cd and Zn.

6. The photovoltaic device of claim 5, wherein said first layer, second layer and third layer comprise Te, Cd and Zn.

7. The photovoltaic device of claim 1, wherein said first layer, second layer and/or said third layers are compositionally graded in Cd and Zn.

8. The photovoltaic device of claim 1, wherein said first layer is chemically doped n-type, the second layer is chemically doped p-type, and the third layer is chemically doped p-type.

9. The photovoltaic device of claim 1, wherein said first layer is chemically doped p-type, the second layer is chemically doped p-type, and the third layer is chemically doped n-type.

10. A photovoltaic device, comprising:
    (a) a substrate or superstrate;
    (b) a first layer adjacent to said substrate or superstrate, said first layer comprising:
       (i) tellurium (Te) and cadmium (Cd) or zinc (Zn), or
       (ii) Te, Cd and Zn, wherein said first layer comprises a p-type chemical dopant;
    (c) a second layer adjacent to the first layer, the second layer comprising Cd and Te, wherein said second layer comprises a p-type chemical dopant; and
    (d) a third layer adjacent to the second layer, the third layer comprising Cd and Te, wherein said third layer comprises an n-type chemical dopant.

11. The photovoltaic device of claim 10, further comprising a layer comprising Zn and Te between said substrate or superstrate and said first layer.

12. The photovoltaic device of claim 10, further comprising a fourth layer adjacent to the third layer, the fourth layer comprising Cd and Te.

13. The photovoltaic device of claim 10, wherein one or more of said first layer, second layer and third layer comprise Te, Cd and Zn.

14. The photovoltaic device of claim 10, wherein
    (a) said first layer and second layer comprise Te, Cd and Zn;
    (b) said first layer and third layer comprise Te, Cd and Zn;
    (c) said second layer and third layer comprise Te, Cd and Zn; or
    (d) said first layer, second layer and third layer comprise Te, Cd and Zn.

15. The photovoltaic device of claim 14, wherein said first layer, second layer and third layer comprise Te, Cd and Zn.

16. The photovoltaic device of claim 10, wherein said first layer, second layer and/or said third layers are compositionally graded in Cd and Zn.

17. The photovoltaic device of claim 10, wherein said first layer comprises tellurium (Te) and cadmium (Cd) or zinc (Zn).

18. The photovoltaic device of claim 10, wherein said first layer comprises Te, Cd and Zn, and wherein said first layer comprises a p-type chemical dopant.

19. A photovoltaic device, comprising:
(a) a low ohmic ZnTe contact layer adjacent to a superstrate or substrate, wherein the low ohmic ZnTe contact layer comprises a p-type dopant;
(b) a p-n heterojunction or homojunction adjacent to said low ohmic ZnTe contact layer, said p-n heterojunction or homojunction comprising:
  (i) a p-type layer comprising cadmium (Cd) and tellurium (Te);
  (ii) an n-type layer comprising Cd and Te adjacent to the p-type layer; and
(c) a low ohmic contact layer comprising Cd and Te adjacent to said p-n heterojunction or homojunction.

20. The photovoltaic device of claim 19, wherein the superstrate or substrate is non-crystalline.

21. The photovoltaic device of claim 19, wherein said p-type layer further comprises Zn.

22. The photovoltaic device of claim 19, wherein said n-type layer further comprises Zn.

23. A photovoltaic device, comprising:
(a) a substrate or superstrate;
(b) a low ohmic contact layer comprising cadmium (Cd) and tellurium (Te) adjacent to said superstrate or substrate, wherein the low ohmic contact layer comprises an n-type dopant;
(c) an n-type layer comprising Cd and Te adjacent to the low ohmic CdTe layer;
(d) a p-type CdZnTe layer adjacent to the n-type layer; and
(e) a low ohmic p-type CdZnTe contact layer adjacent to the p-type CdZnTe layer.

24. The photovoltaic device of claim 23, wherein the superstrate or substrate is non-crystalline.

25. The photovoltaic device of claim 23, wherein said p-type CdZnTe layer and/or said low ohmic p-type CdZnTe layer are compositionally graded in Cd and Zn.

26. The photovoltaic device of claim 23, wherein said n-type layer further comprises Zn.

* * * * *